US010232472B2

(12) United States Patent
Greve et al.

(10) Patent No.: US 10,232,472 B2
(45) Date of Patent: Mar. 19, 2019

(54) TRANSIENT LIQUID PHASE SINTER PASTES AND APPLICATION AND PROCESSING METHODS RELATING THERETO

(71) Applicants: Hannes Greve, College Park, MD (US); F. Patrick McCluskey, Ellicott City, MD (US)

(72) Inventors: Hannes Greve, College Park, MD (US); F. Patrick McCluskey, Ellicott City, MD (US)

(73) Assignee: University of Maryland College Park, College Park, MD (US)

(*) Notice: Subject to any disclaimer, the term of this patent is extended or adjusted under 35 U.S.C. 154(b) by 584 days.

(21) Appl. No.: 14/938,575

(22) Filed: Nov. 11, 2015

(65) Prior Publication Data

US 2016/0129530 A1 May 12, 2016

Related U.S. Application Data

(60) Provisional application No. 62/078,592, filed on Nov. 12, 2014.

(51) Int. Cl.
B23K 35/02 (2006.01)
B23K 35/26 (2006.01)
B23K 1/00 (2006.01)
C22C 13/00 (2006.01)

(52) U.S. Cl.
CPC .......... *B23K 35/025* (2013.01); *B23K 1/0016* (2013.01); *B23K 35/262* (2013.01); *C22C 13/00* (2013.01)

(58) Field of Classification Search
CPC .................................................. B23K 35/025
See application file for complete search history.

(56) References Cited

U.S. PATENT DOCUMENTS 5,806,751 A * 9/1998 Schaefer .............. B23K 1/0018
228/119

OTHER PUBLICATIONS

McCluskey, P. "Reliability of Power Electronics Under Thermal Loading," 7th International Conference on Integrated Power Electronics Systems, Mar. 6-8, 2012.
Funaki et al. (2007) "Power Conversion with SiC Devices at Extremely High Ambient Temperatures," IEEE Transactions on Power Electronics, vol. 22, No. 4, pp. 1321-1329.
Raynaud et al. (2010) "Comparison of High Voltage and High Temperature Performances of Wide Bandgap Seminconductors for Vertical Power Devices," Diamond and Related Materials 19(1):1-6.
Scofield et al. (2010) "Performance and Reliability Characteristics of 1200V, 100A, 200° C. Half-Bridge SiC MOSFET-JBS Diode Power Modules," International Conference on High Temperature Electronics, May 2010, Albuquerque, NM.
Xu et al. "Investigation of Si IGBT operation at 200° C. for traction application," IEEE Transactions on Power Electronics, 28(5):2604-2615.

(Continued)

*Primary Examiner* — Matthew E. Hoban
(74) *Attorney, Agent, or Firm* — William C. Schrot; AuerbachSchrot LLC

(57) ABSTRACT

The present invention relates to transient liquid phase sinter pastes for electronic interconnects, and sinter paste application and processing methods.

17 Claims, 15 Drawing Sheets

(56) References Cited

OTHER PUBLICATIONS

Xu et al. "*Characterization of a High Temperature Multichip SiC JFET-Based Module,*" 2011 IEEE, pp. 2405-2412.
Ryu et al. (2012) "*Ultra High Voltage (>12 kV), High Performance 4H-SiC IGBTs,*" Proc. Int. Symp. Power Semiconductor Devices and ICs, ISPSD'2012, pp. 257-260.
Guth et al. "*New Assembly and Interconnects beyond Sintering Methods,*" PCIM 2010.
Quintero et al. (2009) "*Silver-Indium Transient Liquid Phase Sintering for High Temperature Die Attachment,*" J. Microelectronics and Electronic Packaging 6:66-74.
Kang et al. (2002) "*Isothermal Solidification of Cu/Sn Diffusion Couples to Form Thin-Solder Joints,*" J. Electron. Mater. 31(11):1238-1243.
Nogita et al. "*Inhibition of Cracking in $Cu_6Sn_5$ Intermetallic Compounds at Sn—Cu Lead-Free Solders and Cu Substrate Interfaces,*" International Conference on Electronics Packaging 2009, Kyoto, Japan, pp. 1-6.
Greve et al. (2013) "*Transient Liquid Phase Sintered Attach for Power Electronics,*" 63rd IEEE Electronic Components and Technology Conference, pp. 435-440.
Kim et al. (1995) "*Three-dimensional morphology of a very rough interface formed in the soldering reaction between eutectic SnPb and Cu,*" Appl. Phys. Lett., vol. 66, No. 18, pp. 2337-2339.
Shearer et al. (1999) "*Transient liquid phase sintering composites: Polymer adhesives and metallurgical bonds,*" J. Electron. Mater. 28(11):1319-1326.

\* cited by examiner

TRANSIENT LIQUID PHASE SINTER PASTES AND APPLICATION AND PROCESSING METHODS RELATING THERETO

CROSS-REFERENCE TO RELATED APPLICATIONS

This application is based on U.S. Provisional Patent Application Ser. No. 62/078,592, entitled "Cu—Ni—Sn-Based Transient Liquid Phase Sinter Paste and Process for Joining Using this Paste," filed Nov. 12, 2014, which application is incorporated herein by reference in its entirety and to which priority is claimed.

FIELD OF THE INVENTION

The present invention relates to transient liquid phase sinter pastes for electronic interconnects, and sinter paste application and processing methods.

BACKGROUND OF THE INVENTION

Electronic systems are increasingly used in harsh environments under elevated thermal conditions. This includes applications and products subject to high absolute temperatures as well as very large temperature swings, such as for example deep well drilling (e.g., geothermal, oil or natural gas), military and aerospace, and automotive applications and products.

The secure interconnection of electronic components and materials allows for proper functionality and durability of electronic systems. However, interconnect failure is a major obstacle in the design of reliable electronic systems (McCluskey, P. "*Reliability of Power Electronics Under Thermal Loading,*" $7^{th}$ International Conference on Integrated Power Electronics Systems, Mar. 6-8, 2012). Electric interconnects must provide a multitude of functions. For example, in power electronic applications, these include: mechanically affixing an integrated circuit or chip to a substrate; providing an interface with low thermal resistance for efficient heat transfer from chip to heatsink; and providing an interface with low electrical resistance with high current-carrying capability.

A typical power module structure is shown in FIG. 1, which includes a die attached to a Direct Bond Copper (DBC) substrate via a conventional interconnect or attach material. The DBC is also attached to a copper base, which acts as a heatsink. Significant thermo-mechanical stresses occur within attach layers during operation due to significant differences in the coefficient of thermal expansion (CTE) between the die and the DBC, as well as between the DBC substrate and the heat sink. Harsh environments coupled with growing power densities lead to higher joint temperatures that soften conventional attach materials, making them susceptible to fatigue and reducing their system time-to-failure or in extreme cases, leading to melting of the attach material. Furthermore, the thermo-mechanical stresses increase with increasing temperatures. Conventional attach materials utilized in power electronics were developed for application temperatures between about 100° C. and 150° C. Such conventional attach materials include solders with melting temperatures ($T_m$) in the range of between about 200° C. to 300° C. As such, they are not suitable for applications at elevated temperature conditions (e.g., such as 200° C. or higher).

In automotive applications, the integration of microelectronic systems in the engine compartment, referred to as the under-the-hood environment, increases thermal load on such systems due to heat dissipated by the engine during operation. With the commercial success of electric vehicles (EV) and hybrid electric vehicles (HEV), power electronic systems for energy storage and conversion are used ubiquitously in automotive applications. With temperatures of the liquid coolant of 75° C. and more, to ensure reliable operation of silicon (Si) power devices at temperatures below 150° C., power densities have to be limited, or considerable effort concerning the thermal management systems is required, e.g. such as by providing a secondary liquid cooling loop. However, additional cost as well as increased weight and volume requirements are associated with these efforts.

Another industry with continually increasing requirements for electronic systems is the aerospace industry, wherein systems are routinely exposed to severe conditions. Planned space explorations require that electronic systems are capable of withstanding extreme pressures, stresses and temperatures. For example, the exploration of Venus will require that systems are capable of withstanding an atmospheric pressure more than 90 times greater than that on earth, temperatures of 467° C. or higher, and highly corrosive sulfuric acid. Thus, applications in such severe environmental conditions, coupled with increasing power densities and miniaturization necessitate the need for electronic systems capable of functioning at higher temperatures.

Traditional Si devices are limited to relatively low voltage operation, and are not suitable for use at temperatures above 175° C. due to their material properties as a low band-gap semiconductor. Therefore, devices based on the wide bandgap (WBG) semiconductor materials (e.g., such as silicon carbide (SiC) and gallium nitride (GaN)) have been introduced. Compared to traditional Si devices, SiC and GaN devices may be operated at higher temperatures, exhibit higher heat dissipation, possess higher breakdown voltages, and enable higher switching frequencies with reduced switching losses. Multiple systems operating in temperature ranges up to 200° C. and above have been presented. For example, the operation of a DC-DC converter based on SiC junction gate field-effect transistors (JFETs) and Schottky barrier diodes (SBDs) was demonstrated at temperatures up to 450° C. (Funaki et al. (2007) "*Power Conversion with SiC Devices at Extremely High Ambient Temperatures,*" *IEEE Transactions on Power Electronics*, vol. 22, no. 4).

Thus, SiC has become the semiconductor material of choice for manufacturing many power electronic devices. Devices made with SiC can block more voltage in the reverse bias direction because of its inherently larger breakdown strength. In addition, SiC permits devices to have a faster switching speed, thereby allowing operation at a higher frequency because of its higher saturated electron drift velocity. SiC also provides better heat transfer because of its higher bulk thermal conductivity. Further, SiC permits higher temperature operation, because of its larger bandgap. This ability to operate at higher temperatures permits devices to be operated at higher power with higher dissipation without requiring more cooling capacity. It is, however, this operation at higher temperature that has created a major packaging challenge.

Packaging and interconnect technologies applied in conventional microelectronic systems were developed for traditional Si-based devices, which are limited to relatively low temperature applications (e.g., temperatures below 200° C.) (see Raynaud et al. (2010) "*Comparison of High Voltage and*

High Temperature Performances of Wide Bandgap Semiconductors for Vertical Power Devices," Diamond and Related Materials 19(1):1-6; Scofield et al. (2010) "*Performance and Reliability Characteristics of 1200V, 100A, 200° C. Half-Bridge SiC MOSFET-JBS Diode Power Modules*," International Conference on High Temperature Electronics, May 2010, Albuquerque, N. Mex.; see also Xu et al. "*Investigation of Si IGBT operation at 200° C. for traction application*," Energy Conversion Congress and Exposition (ECCE), 2011 IEEE, Sep. 17-22, 2011, Phoenix, Ariz.; Xu et al. "*Characterization of a High Temperature Multichip SiC JFET-Based Module*," Energy Conversion Congress and Exposition (ECCE), 2011 IEEE, Sep. 17-22, 2011, Phoenix, Ariz.; Ryu et al. (2012) "*Ultra High Voltage (>12 kV), High Performance 4H-SiC IGBTs*," Proc. Int. Symp. Power Semiconductor Devices and ICs, ISPSD'2012, pp. 257-260).

For example, eutectic $Sn_{37}Pb$ solder alloys have traditionally been utilized as interconnect or attach material in electronic systems. However, they have a melting temperature ($T_m$) of 183° C., which is far too low for high temperature applications. Additionally, eutectic $Sn_{37}Pb$ solders show relatively high creep rates at elevated temperatures and are subject to many regulatory restrictions. As such, they are not suitable for many applications.

Eutectic Sn3.5Ag and SAC305 (Sn—Ag—Cu) alloys also possess comparatively low melting temperatures of 221° C. and 217° C., respectively. They are frequently used as substitute materials for $Sn_{37}Pb$ solder (which is being phased out by regulatory restrictions) due to their similar $T_m$ and wetting behavior. However, similar to other lead (Pb)-based solders, they are highly ductile and soften close to their $T_m$, limiting their fatigue life. They are therefore utilized for low temperature applications.

Bi—Ag alloys, while less conventional, are another reflow solder interconnect, which possess liquidus temperatures of 262° C. However, they exhibit brittle behavior with limited ductility and elongation. Such problems can be slightly mitigated by increased ratios of silver (Ag), but at substantially higher cost. Moreover, they possess limited wetting capabilities and low thermal conductivities. As such, Bi—Ag solders have not proven reliable or efficient for many applications.

Solders with Pb as the main constituent (e.g., such as Pb5.0Sn2.5Ag) have melting temperatures of 296° C. Their use is restricted by regulations for most applications, with a few exceptions such as military applications and as die attach. As such, their availability has been substantially reduced due to the shrinking market and the possibility they will be entirely restricted by future regulations (e.g., such as the Restriction of Hazardous Substances Directive). Moreover, they require relatively high processing temperatures, and exhibit high creep rates at elevated temperatures.

A few alloys with gold (Au) as a main constituent are available, including Au20Sn, Au12Ge, and Au3.2Si, with melting temperatures of 280° C., 361° C., and 363° C., respectively. They form relatively strong joints with good fatigue life, but must be processed at high temperatures. Moreover, relatively high costs are associated with these alloys, which inhibit their use in many applications.

Other solder alloys provide zinc (Zn) as the main constituent, including Zn6Al and Zn5.8Ge, with melting temperatures of 381° C. and 390° C., respectively. However, such alloys also require relatively high process temperatures, with complicated and expensive processing techniques.

Suitable interconnect materials and processing techniques therefore remain a major challenge in the design of reliable high-temperature packages for power electronic devices and systems. Wide temperature swings and high temperatures substantially increase thermo-mechanical stresses imparted on a device. At elevated temperatures, the solder strength decreases while deformation or creep accelerates, resulting in increased deformation during each load cycle and a reduction in fatigue life. Established solder technologies have failed to overcome such problems and to provide for reliable high temperature operation.

Thus, there is a need for alternative interconnect materials, as well as alternative application and processing methods, which overcome some or all of the above-noted problems.

SUMMARY OF THE INVENTION

The present invention is directed to sinter pastes, and application and processing of sinter pastes that enable the formation of Transient Liquid Phase Sintered (TLPS) interconnects at relatively low processing temperatures. The resulting sinter joints exhibit little or no voiding, and extremely high strength and reliability. Disclosed sinter pastes comprise two or more distinctively different sinter paste systems, which when processed together, form a TLPS joint. The sinter pastes may be applied by dispensing (e.g., via a syringe or nozzle), printing (e.g., stencil printing), and other application methods known in the art, as well as a combination of such application methods.

In some implementations, nickel-tin (Ni—Sn) and nickel-copper-tin (Ni—Cu—Sn) sinter pastes are provided as an interconnect material for TLPS sinter joints in electronic systems. The disclosed pastes exhibit superior microstructures, extremely high application temperature limits, and excellent durability as compared to conventional interconnect technologies.

The present invention relates to a method of forming a joint in an electronic system comprising the steps of: applying a first sinter paste onto a substrate, wherein the first sinter paste comprises low melting temperature metal particles intermixed with high melting temperature metal particles; applying a second sinter paste onto the substrate and surrounding the first sinter paste, wherein the second sinter paste comprises low melting temperature metal particles intermixed with high melting temperature metal particles; aligning a component with the substrate so that the applied first sinter paste is intermediate and contacting the component and the substrate; initiating a sintering process at a process temperature so that the low melting temperature metal particles melt and infiltrate spaces between the high melting temperature particles, thereby forming a sintered joint comprising intermetallic compounds. In one implementation, the formed sintered joint comprises intact high melting temperature metal particles in addition to the intermetallic compounds.

In one embodiment, the first sinter paste comprises a first weight percent of the high melting temperature metal particles and a second weight percent of the low melting temperature metal particles, wherein the first weight percent is greater than the second weight percent. In one implementation, the first weight percent is at least about twice the second weight percent.

In one embodiment, the second sinter paste comprises a third weight percent of the low melting temperature metal particles and a fourth weight percent of the high melting temperature metal particles, wherein the third weight percent is greater than the fourth weight percent. In one embodiment, the third weight percent is at least about twice the fourth weight percent.

In one embodiment, the method comprises the additional step of drying the applied first sinter paste by heating the paste and substrate to a temperature below a melting temperature of the low melting temperature metal particles.

In one embodiment, the second applied second sinter paste has a thickness substantially equal to a thickness of the applied first sinter paste. In another embodiment, the applied second sinter paste has a thickness greater than the thickness of the applied first sinter paste.

In one embodiment, the intermetallic compounds have a melting temperature more than 100° C. greater than a melting temperature of the low melting temperature metal particles. The intermetallic compounds may have a melting temperature at least twice the melting temperature of the low melting temperature metal particles.

In one embodiment, the method further comprises the step of reacting less than 90% of the high melting temperature metal particles of the first and second sinter pastes during sintering, so that the formed sintered joint comprises intermetallic compounds and a plurality of intact high melting temperature metal particles.

The present invention also relates to sinter pastes for forming joints in electronic systems. In one embodiment, a sinter paste comprises a mix of low melting temperature metal particles and high melting temperature metal particles, wherein the high temperature metal particles comprise between about 10 and about 40 weight percent nickel and between about 10 and about 40 weight percent copper; and where the low melting temperature metal particles comprise between about 20 and about 80 weight percent tin, all in a binder material. In one implementation, the mix comprises at least about 50% tin.

DETAILED DESCRIPTION OF EMBODIMENTS OF THE INVENTION

Figure 1:
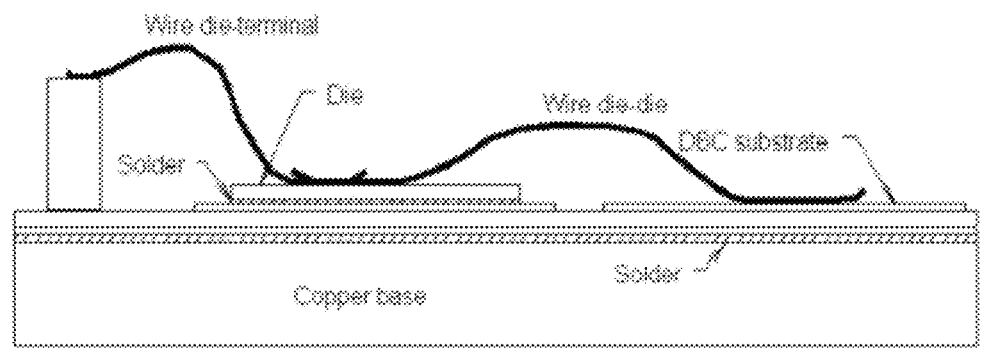
FIG. 1 is a schematic of a typical power module structure including a die attached to a substrate via a solder material, with the substrate also attached to a copper base via the solder material.

The present invention is directed to interconnect materials, and applications and processes for interconnect materials. In accordance with disclosed embodiments, Cu—Ni—Sn-based transient liquid phase sinter pastes are provided for use in electronic interconnects or joints. Transient liquid phase sintering (TLPS) may be used to form joints at relatively low process temperatures. The joints comprise intermetallic compounds (IMCs) which, due to a melting temperature shift during processing, may be utilized at relatively high temperatures. In addition, the resulting joints also preferably comprise, in addition to the formed IMCs, intact high melting temperature particles that were not consumed during the sintering process. The presence of such high melting temperature particles in combination with the formed IMCs substantially increases joint strength. The disclosed TLPS sinter pastes and processes provide for reliable interconnection in electronic systems, exhibiting superior strength compared to conventional interconnects. The resulting joints are suitable for applications exposed to extreme temperature conditions and/or high mechanical stresses.

Conventional high-temperature solders, such as Pb- or Au-based alloys, require relatively high processing temperatures that are significantly above their melting temperatures. Traditional sintering of Ag-based alloys requires high processing pressures. Sintering processes utilizing non-noble metals are relatively complicated, and produce joints with comparatively low strength. In contrast, TLPS joints may be formed at much lower process temperatures and minimal pressures, but enable high temperature application and reliable mechanical performance (Guth et al. "*New Assembly and Interconnects beyond Sintering Methods*," PCIM 2010; see also Quintero et al. (2009) "*Silver-Indium Transient Liquid Phase Sintering for High Temperature Die Attachment*," J. Microelectronics and Electronic Packaging 6:66-74). Processing of TLPS joints may also be accomplished with a flux, and without vacuum. In addition, the interconnect material may include relatively low cost constituents (e.g., Ni, Cu, Sn).

TLPS systems according to disclosed embodiments include sinter pastes comprising Cu, Ni, and Sn or Sn-based solders. By limiting process duration and/or providing a sufficient percentage of the high melting temperature metal constituent (e.g., Cu, Ni) in the sinter paste composition, the resulting joint comprises intact metallic particles of the high melting temperature constituent as well as IMCs. For example, an exemplary sinter paste composition may comprise about 85-95% metal particles and 5-10% flux binder material, wherein 60-70% of the metal particles comprise a high melting temperature metal constituent and 30-40% comprise a low melting temperature metal constituent. The sinter paste may therefore include more high melting temperature constituent than needed in order to fully form IMCs. The duration of processing may also be limited, so that not all of the high melting temperature metal is consumed during sintering (e.g., wherein 10-40% of the high melting temperature metal particles remain intact in the resulting joint). The resulting joint, which includes intact high melting temperature particles coupled with the formed IMCs, exhibits superior mechanical properties as compared to conventional TLPS joints.

According to some embodiments, Cu—Sn, Ni—Sn and (Ni,Cu)—Sn TLPS sinter pastes enable the formation of joints with a microstructure characterized by intact metallic particles (Ni, Cu) embedded in a matrix of Ni—Sn, Cu—Sn, and/or (Ni,Cu)—Sn intermetallics. The disclosed sinter pastes are processed at relatively low temperatures (e.g., at processing temperatures of about 20° C. to about 50° C. above the melting-temperature of the low melting point constituent, e.g., Sn), and with relatively short process durations, but possess relatively high melting temperatures upon process completion (e.g., 100° C. or more above the processing temperature), and exhibit superior mechanical properties. No application of vacuum or reducing atmosphere is required during processing.

Compared to conventional attach materials, the sinter pastes of the present invention also exhibit excellent wetting capabilities with no or minimal voiding, and possess superior joint strength. In some implementations, joints formed from the disclosed sinter pastes and/or in accordance with disclosed processes demonstrate reliability up to temperatures of 600° C. or more. The resulting joints also demonstrate superior drop test reliability (e.g., such as Ni—Sn sinter joints formed in accordance with disclosed embodiments, as compared to joints formed with conventional Sn3.5Ag solder). Thus, the disclosed materials and processes, and joints formed therefrom, provide reliable interconnects in electronic applications subject to environments with high temperature requirements.

The present invention provides for methods of sinter paste application and processing that enable the formation of superior TLPS interconnects. Preferably, the application of two or more distinctively different sinter paste systems is provided, which when processed together form a TLPS joint. The sinter pastes may be applied by any method known in the art, including but not limited to dispensing using a syringe or nozzle, printing (e.g., such as stencil printing), or a combination of two or more methods. Depending on the application method utilized, it may be appropriate to increase or decrease paste viscosity (e.g., such as by increasing or decreasing percentage of flux binder, wherein an increase in flux binder decreases viscosity). The paste-based TLPS interconnect technology of the present invention enables rapid formation of reliable high-temperature interconnects at a low processing temperature, with low void levels and exhibiting high strength and reliability.

TLPS sinter pastes comprise particles of metallic alloys or pure metals embedded in a matrix of organic or inorganic flux binder and/or flux material(s). The flux binder material can include suitable activators, such as activators that comprise about 0.5% by volume of the flux material, where a rosin or some resin, natural or synthetic, that serves as a base or medium for the flux comprises about 75% by volume of the flux material. Natural or synthetic rosins or resins can contribute to the activity of the flux, but additional activator may also be provided to improve the cleaning strength of the system. Activators can be chosen from a wide variety of chemical substances including inorganic acids and salts, amines, organic acids, and any other suitable substance as known in the art.

TLPS is a liquid-assisted sintering process for the joining of metallic or metallized surfaces. During processing, the process temperature ($T_p$) is raised above the melting temperature ($T_m$) of a metallic low melting-temperature constituent (A), which melts, causing liquid phase constituent A to surround and diffuse into a higher melting-temperature solid metal constituent (B). Intermetallic compounds (IMCs) with high melting temperatures are thereby formed by liquid-solid diffusion. TLPS systems are processed at relatively low temperatures (whereby the processing temperature is greater than the low melting-temperature constituent A but lower than the high melting-temperature constituent B, or $T_{m,A}<T_p<T_{m,B}$, but result in joints and thus devices capable of operating at the high melting temperatures of the formed IMCs.

The concentration of constituent B in constituent A increases until the saturation limit of the liquid phase is reached. IMCs of constituents A and B form at the solid-liquid interface. Their further growth is controlled by solid state diffusion of constituent A in constituent B. Constituent A is consumed by IMC formation, and the concentration of constituent B in the liquid phase increases until the concentration has reached the point when a phase transformation to a solid state occurs, leading to complete joint solidification. The diffusion and growth of IMCs continues, until the liquid phase is completely consumed and all of constituent A is transformed to IMCs, a process referred to herein as process completion. The resulting joint consists of pure constituent B bridged by AxBx IMCs. Adequate amounts of constituent B must be present to achieve full consumption of constituent A and process completion. As noted above, process temperature ($T_p$) exceeds the melting temperature of constituent A ($T_{m,A}$) but is lower than the melting temperature of constituent B ($T_{m,B}$). The finalized joint possesses the melting temperature of the IMCs ($T_{m,IMC}$), which is much greater than the melting-temperature of constituent A (wherein $T_{m,IMC}>T_{m,A}$). Processing of joints at low temperature is thereby enabled, which forms joints that are able to withstand high application temperatures.

Figure 2:
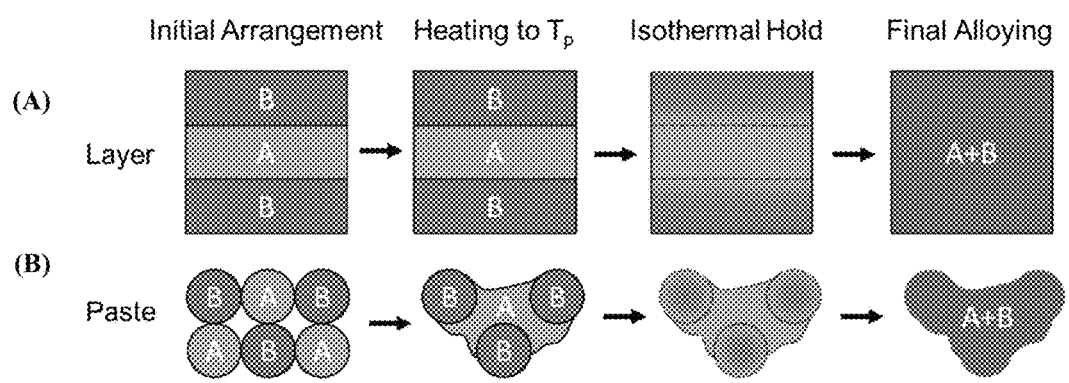
FIG. 2 illustrates schematically the formation of TLPS sinter joints by a layer-based approach (plate (A)) and a paste-based approach (plate (B)). The low- and high-melting temperature constituents are identified as "A" and "B" respectively.

Traditional TLPS systems for electronic applications provide for the joining of two layers of a high melting temperature metallization by consuming a layer of low melting temperature constituent sandwiched between them, as shown in FIG. 2, plate (A). In such layer-based processing, constituent A (low $T_m$) is sandwiched between layers of constituent B (high $T_m$). IMCs grow from the joint interface between layers of constituent B toward the center line of constituent A. The IMC thickness is identical to the joint thickness. For example, layer-based TLPS systems with Sn or In as the low melting point constituent include (Ag, Au, Cu, Ni)—Sn and (Ag, Au)—In.

In TLPS systems, growth of IMCs is controlled by Fick's second law of diffusion, which provides that diffusion length (or IMC thickness) is proportional to the square root of time ($l_{IMC} \sim t^{1/2}$). Thicker joints therefore require considerably long process times or high process temperatures to accelerate diffusion. This limits the achievable joint thickness formed by traditional layer-based approaches. As a result, layer-based processes are relatively slow, and require considerable time for process completion even for TLPS systems with relatively high diffusivities (e.g., Cu—Sn requires a process time of about 3.5 hours; see Kang et al. (2002) "*Isothermal Solidification of Cu/Sn Diffusion Couples to Form Thin-Solder Joints*," J. Electron. Mater. 31(11):1238-1243). In addition, layer-based approaches are limited to a relatively thin joint thickness (e.g., about 10 μm or less).

Figure 3:
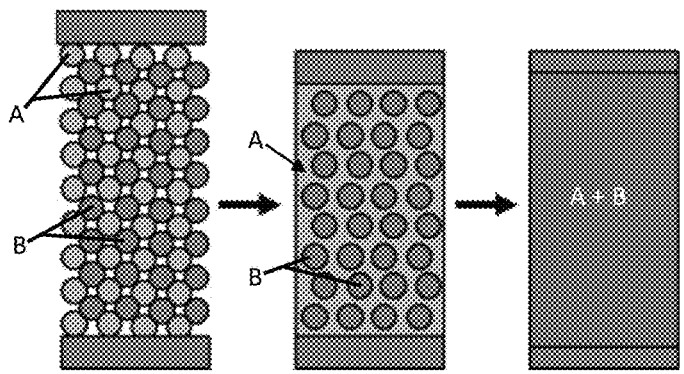
FIG. 3 illustrates schematically a paste-based TLPS process showing homogenous and simultaneous IMC formation. The required diffusion length is relatively small as compared to joint thickness.

A paste-based approach overcomes limitations of the layer-based approach, enabling the simultaneous and homogenous formation of IMCs and sintering throughout the joint, as shown in FIG. 2, plate (B), and in FIG. 3. A mix of constituent A (low $T_m$) and constituent B (high $T_m$) is provided. As particles of the high melting temperature constituent B are present throughout the joint, IMCs are formed at multiple interfaces. IMCs grow from the interfaces between constituent A and constituent B, whereby joint densification occurs by capillary forces. Organic binders and/or fluxes (e.g., 5-15 wgt-%) may be provided in order to prevent particle oxidation during processing and to facilitate the sintering process.

The paste-based approach is relatively fast as compared to layer-based approaches. The required individual IMC thicknesses are relatively small compared to the layer-based approach. The IMC joint is formed by multiple IMCs bridging individual high melting temperature particles. This reduces the process completion time by orders of magnitude as compared to traditional layer-based TLPS processes. Process completion time may be further reduced if excess high melting temperature material is present in the sinter paste, and IMCs are only required for forming small bridges between these particles. However, inadequate joint densification may lead to voiding in the joint.

Thus, the paste-based TLPS approach overcomes the thickness limitations associated with layer-based approaches. Sinter pastes with a mix of high-$T_m$ and low-$T_m$ constituents are applied between the surfaces to be joined. This reduces the required diffusion length for the formation of a fully sintered joint significantly. Paste-based TLPS thus substantially reduces process temperature required and process durations as compared to layer-based TLPS. In accordance with disclosed embodiments, strength and mechanical properties of TLPS joints may be further enhanced by controlling the percentages of constituent A (low $T_m$) and/or constituent B (high $T_m$) in the sinter pastes, by controlling the duration of processing, and/or by providing for multistep paste application processes, as described in further detail below.

Processing of Transient Liquid Phase Sinter Pastes

Cu—Sn systems have been suggested as potential TLPS technology for electronic interconnect applications (see U.S. Patent Publication No. 2010/0096043, the disclosure of which is incorporated herein by reference). The high diffusivity of Cu and Sn compared to other systems reduces the required process time. However, studies have shown that the Cu—Sn intermetallics are brittle and susceptible to failure in some applications under cyclic drop and vibration loads. Furthermore, the $Cu_6Sn_5$ IMCs show a phase transformation from the monoclinic η'-phase below 186° C. to the hexagonal n-phase above 186° C. If upon cooling, the more ductile hexagonal phase remains initially and later transforms to the monoclinic phase, there is an increase in volume associated with this transformation (see Nogita et al. "*Inhibition of Cracking in $Cu_6Sn_5$ Intermetallic Compounds at Sn—Cu Lead-Free Solders and Cu Substrate Interfaces*," International Conference on Electronics Packaging 2009, Kyoto, Japan, (1-6), Apr. 14-16, 2009), which can lead to considerable stresses being generated in the joint and subsequently to cracking in the more brittle monoclinic $Cu_6Sn_5$ IMC. The presence of Ni has been shown to stabilize the higher temperature hexagonal phase, reducing the incidence of cracking, by forming a $(Cu_{6-x}Ni_xSn_5)$ intermetallic phase, where the Ni composition can range from x=0.5 to x=2 with x=2 being the most stable composition.

In accordance with the present invention, TLPS sinter pastes are provided which utilize the structure stabilizing properties of substituting a portion of Cu with Ni. Ni and Cu are fully soluble over the entire temperature range. As a result, Ni atoms occupying the atomic positions in $Ni_3Sn_4$ IMCs can relatively easily exchange their position with Cu atoms by diffusion and form $(Ni,Cu)_3Sn_4$ IMCs. Similarly, Cu atoms occupying the atomic positions in $Cu_6Sn_5$ and $Cu_3Sn$ IMCs can relatively easily exchange their position with Ni atoms by diffusion and form $(Cu,Ni)_6Sn_5$ and $(Cu,Ni)_3Sn$ IMCs.

(Cu,Ni)—Sn IMCs do not exhibit the phase transformation seen in $Cu_6Sn_5$ IMCs. IMCs formed in (Cu,Ni)—Sn joints prohibit this phase transformation after process completion, which substantially reduces stresses within the joint and thus enables the fabrication of more reliable interconnects capable of high-temperature application. This advantage is especially pronounced when the joint is subject to cyclic temperature excursions above and below 186° C., which for $Cu_6Sn_5$ IMCs leads to repeated phase transformations, as noted above. Given (Cu,Ni)—Sn IMCs do not show such phase transformation, $(Cu,Ni)_6Sn_5$ IMCs do not undergo these stresses.

The disclosed sinter pastes are a mix of Ni-, Cu-, and Sn-based particles. Sn-based means that the main constituent of the particle is pure Sn, or a Sn-rich solder alloy, including but not limited to Sn—Cu-, Sn—Ag-, and Sn—Cu—Ag-alloys. In one implementation, the addition of Ni leads to the formation of $(Cu,Ni)_6Sn_5$ IMCs that show a considerable reduction in the susceptibility to cracking. In addition, in contrast to $Cu_6Sn_5$, $(Cu,Ni)_6Sn_5$ IMCs do not show a phase transformation.

According to disclosed embodiments, multi-step reflow processes are provided wherein a first sinter paste is applied (e.g., via deposition with a nozzle or stencil printing) on a substrate or surface, following by application of a second sinter paste (e.g., via deposition with a nozzle or stencil printing), and subsequently sintered.

The first sinter paste preferably includes more high melting temperature ($T_m$) metal particles (constituent B) than low $T_m$ metal particles (constituent A). For example, of the total metal particles present in the first sinter paste, preferably 60-90 wgt-%, more preferably 75-85 wgt-%, are high $T_m$ metal particles, and 10-40 wgt-%, more preferably 15-25 wgt-%, are low $T_m$ metal particles. The first sinter paste may additionally include a flux binder material, e.g., 5-20 wgt-%, more preferably 8-12 wgt-%, flux binder material with the remaining 80-95 wgt %, more preferably 88-92 wgt-%, being the mixture of metal particles.

The second sinter paste preferably includes more low melting temperature ($T_m$) metal particles (constituent A) than high $T_m$ metal particles (constituent B). For example, of the total metal particles present in the second sinter paste, preferably 60-90 wgt-%, more preferably 75-85 wgt-%, are low $T_m$ metal particles, and 10-40 wgt-%, more preferably 15-25 wgt-%, are high $T_m$ metal particles. The second sinter paste may also include a flux binder material, e.g., 5-20 wgt-%, more preferably 8-12 wgt-%, flux binder material with the remaining 80-95 wgt-%, more preferably 88-92 wgt-%, being the mixture of metal particles.

Exemplary paste application process alternatives are described below, wherein a first sinter paste ("Paste 1") is applied (e.g., via deposition or printing) on a substrate. Paste 1 is preferably heavily loaded with high $T_m$ metal particles, as described above. After application of Paste 1, the substrate and Paste 1 may be heated at a temperature less than the melting-temperature of Paste 1 (below $T_{m,A}$) in order to reduce the content of flux binder in the paste, which step is referred to herein as "drying". A second sinter paste ("Paste 2") is then applied after the application of Paste 1 and reflow processed. Paste 2 is preferably heavily loaded with low $T_m$ metal particles, as described above. After application of Paste 2, a sintering process is initiated with a process temperature higher than the melting-temperature of constituent A (i.e., above $T_{m,A}$).

Figure 4:
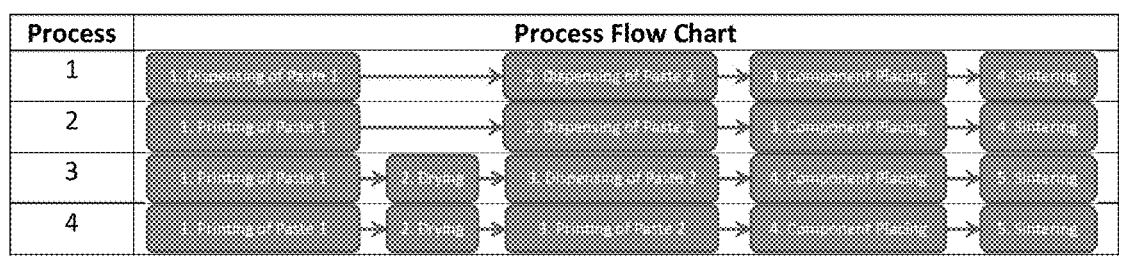
FIG. 4 is a table of flowcharts showing paste application processes in accordance with embodiments of the present invention.
Figure 5:
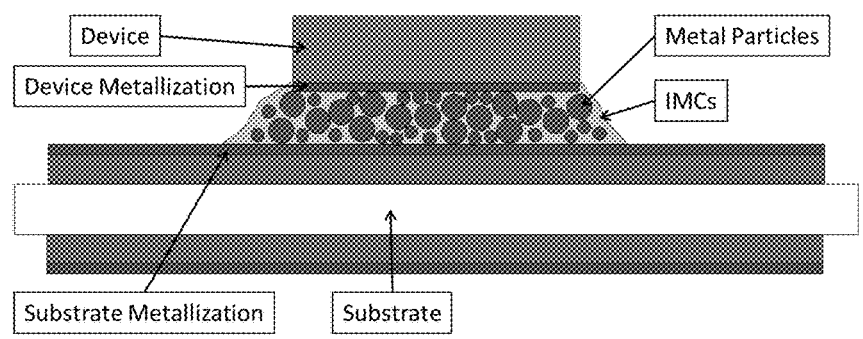
FIG. 5 illustrates schematically a structure of a device attached to a substrate via a sinter joint via disclosed processes.

Referring to FIG. 4, four exemplary paste application processes are outlined which include the application of Paste 1 via nozzle deposition or printing, and the subsequent application of Paste 2 via nozzle deposition or printing. Process 1 includes dispensing of Paste 1 and dispensing of Paste 2. Process 2 includes printing of Paste 1 and dispensing of Paste 2. Process 3 includes printing of Paste 1, drying, and dispensing of Paste 2. Process 4 includes printing of Paste 1, drying, and printing of Paste 2. After application of Pastes 1 and 2, processes 1-4 all provide for component placement and sintering, and result in a final structure after processing including a device secured to a substrate via a sintered joint, as shown in FIG. 5.

Process 1: Dispensing and Dispensing (FIG. 6)

Figure 6:
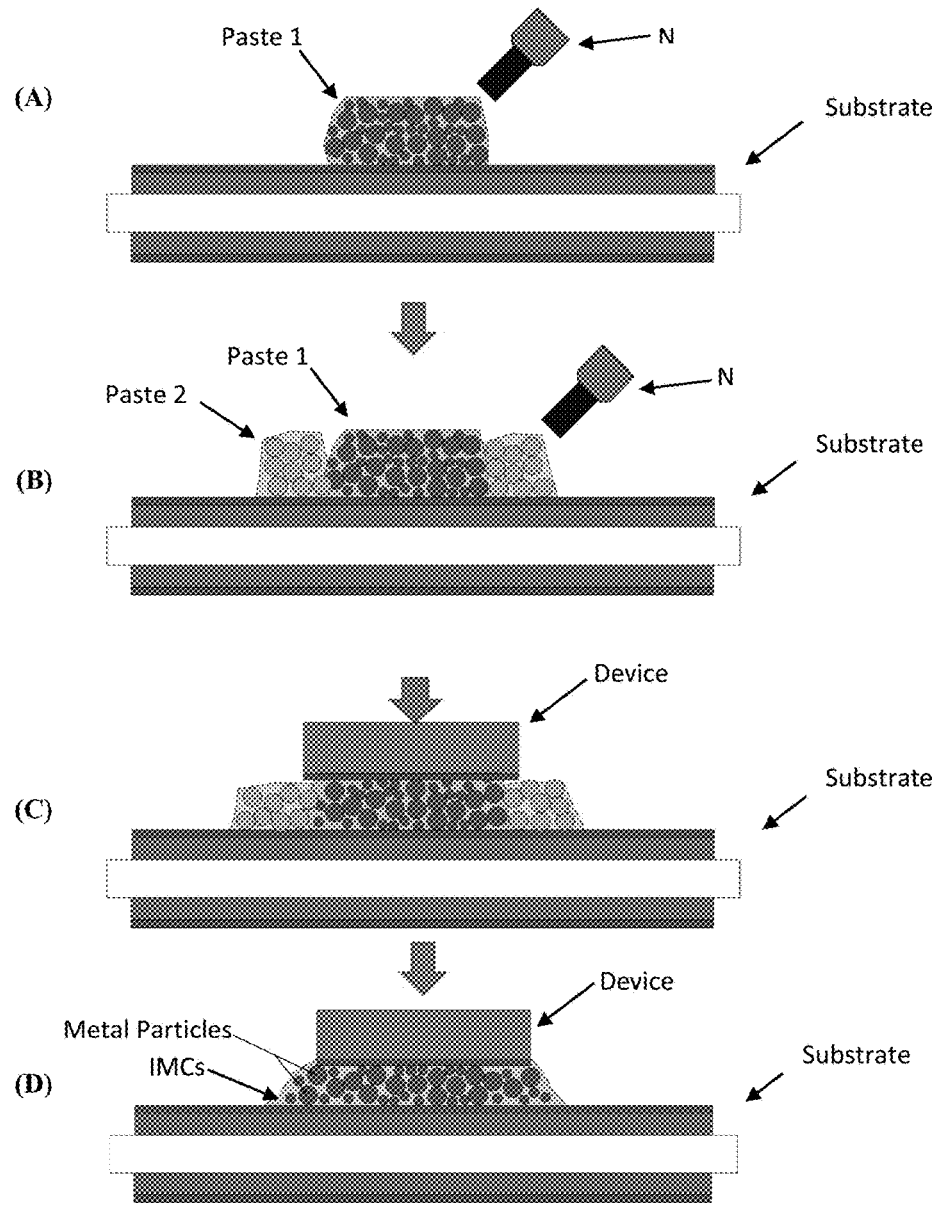
FIG. 6 illustrates schematically a paste application process including: dispensing Paste 1 onto a substrate (plate A), dispensing Paste 2 around dispensed Paste 1 (plate B); placing a device onto dispensed Paste 1 (plate C); and forming a TLPS joint after sintering (plate D).

Paste 1 is dispensed on a substrate surface, such as with a syringe or nozzle N (FIG. 6, plate A). Next, a ring of Paste 2 is dispensed around the dispensed layer of Paste 1 (plate B), such as with nozzle N. Paste 1 is preferably heavily loaded with high $T_m$ metal particles and Paste 2 is preferably heavily loaded with low $T_m$ metal particles, as described above. A device is then aligned with and placed onto the area of dispensed Paste 1 (plate C). A sintering process is then initiated with a temperature profile, wherein solid state diffusion occurs. After the sintering process is completed, the joint is fully transformed to IMCs, and more preferably includes IMCs as well as intact metal particles of constituent B. During sintering, the low temperature alloy (constituent A) melts. Shortly after the melting is completed, the low temperature alloy infiltrates the spaces between the high temperature particles (constituent B), thus initiating formation of IMCs (plate D).

Process 2: Printing and Dispensing (FIG. 7)

Figure 7:
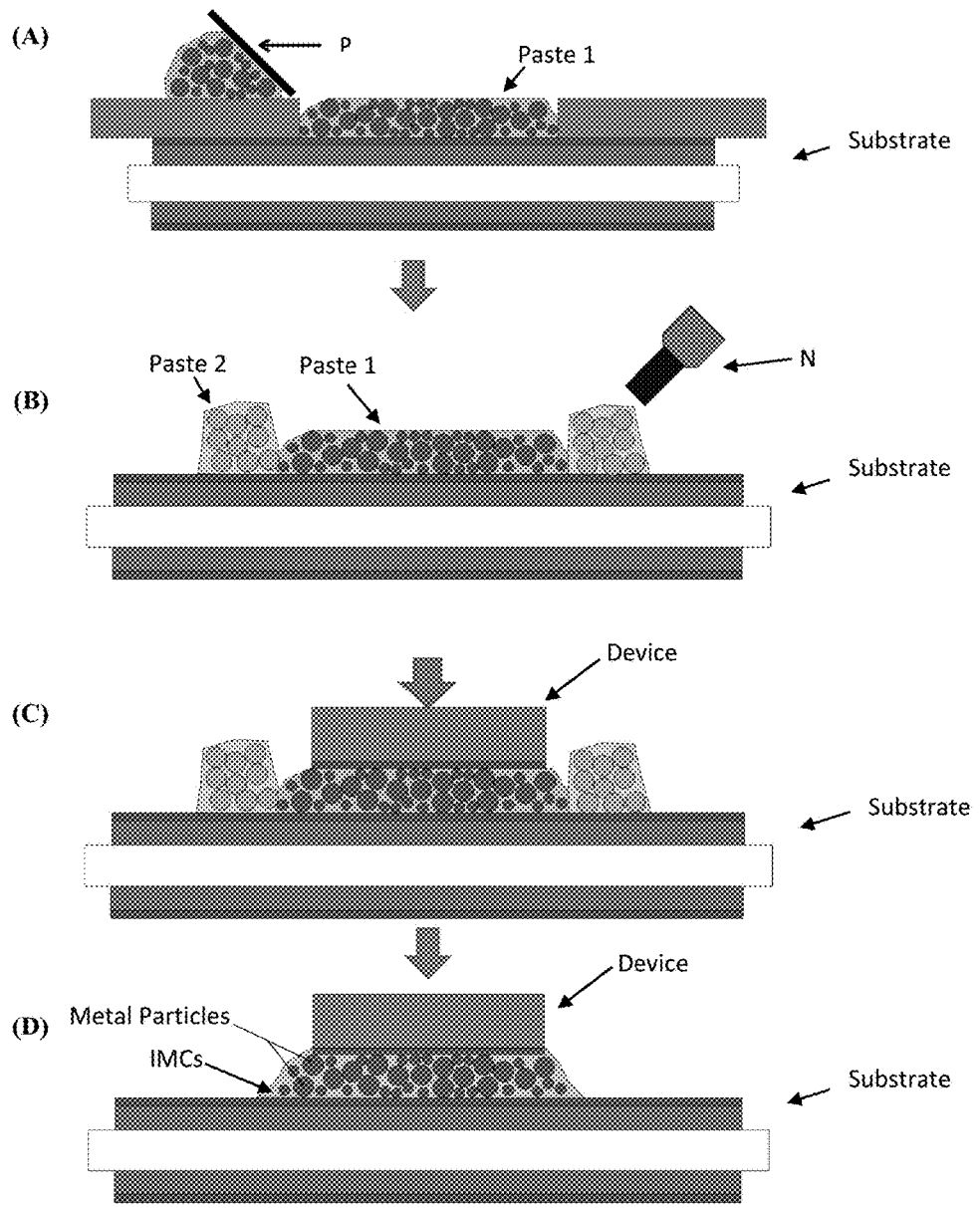
FIG. 7 illustrates schematically a paste application process including: stencil printing Paste 1 onto a substrate (plate A), dispensing Paste 2 around printed Paste 1 (plate B); placing a device onto printed Paste 1 (plate C); and forming a TLPS joint after sintering (plate D).

Paste 1 is printed on a substrate surface, such as by stencil printing P (FIG. 7, plate A). Next, a ring of Paste 2 is dispensed around the printed layer of Paste 1 (plate B). Paste 1 is preferably heavily loaded with high $T_m$ metal particles and Paste 2 is preferably heavily loaded with low $T_m$ metal particles. A device is then aligned with and placed at the center of and onto the area of printed Paste 1 (plate C). A sintering process is then initiated with a temperature profile. After the sintering process is completed, the joint is fully transformed to IMCs, and more preferably comprises IMCs and intact metal particles as described above. During sintering, the low temperature alloy (constituent A) melts. Shortly after the melting is completed, the low temperature alloy infiltrates the space between the high temperature particles (constituent B), thus initiating formation of IMCs (plate D).

Process 3: Printing, Drying and Dispensing (FIG. 8)

Figure 8:
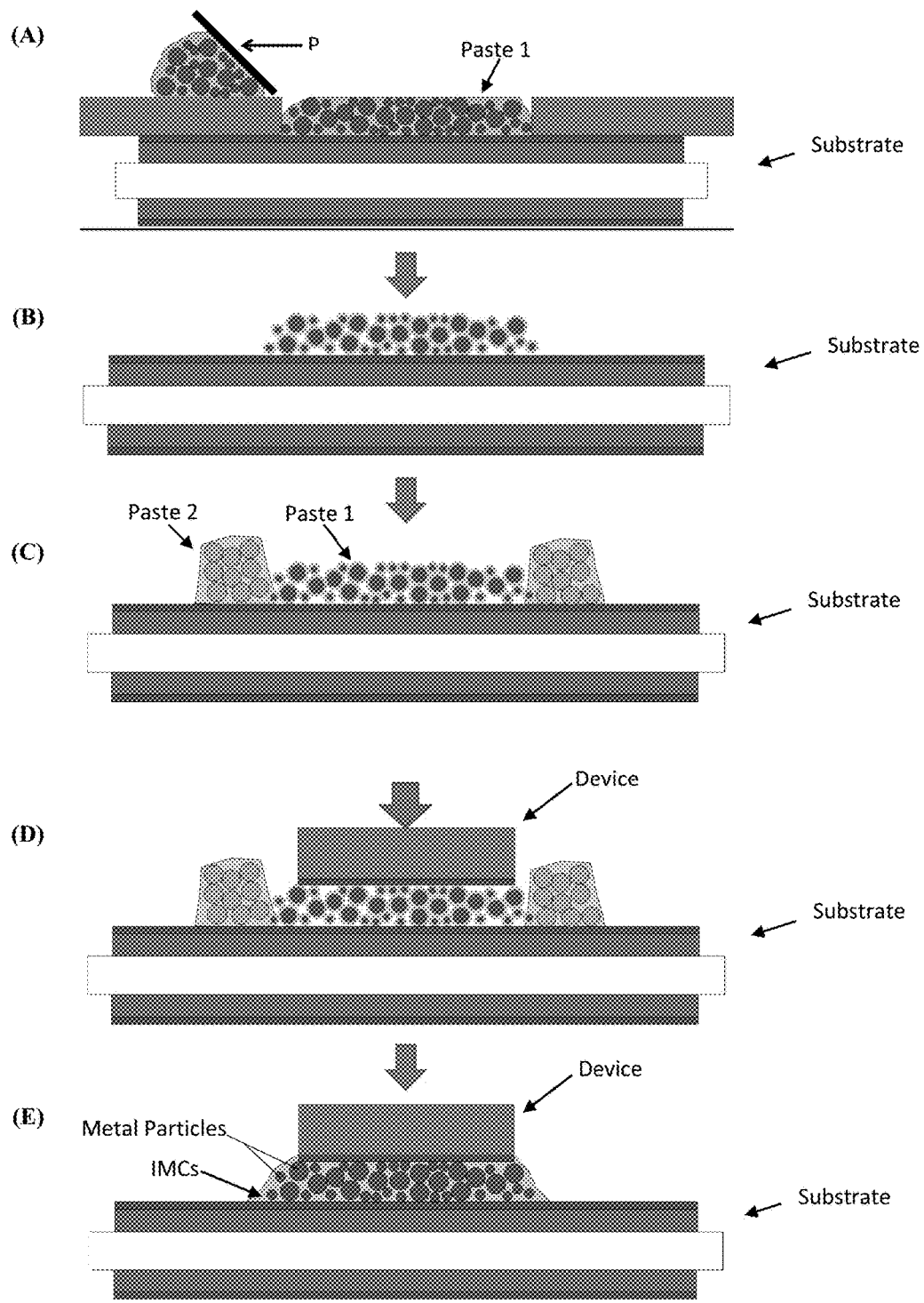
FIG. 8 illustrates schematically a paste application process including: stencil printing Paste 1 onto a substrate (plate A), drying the printed Paste (plate B); dispensing Paste 2 around printed and dried Paste 1 (plate C); placing a device on printed Paste 1 (plate D); and forming a TLPS joint after sintering (plate E).

Paste 1 is printed on a substrate surface, such as by stencil printing P (FIG. 8, plate A). Next, the layer of Paste 1 printed on the substrate is heated to a temperature below $T_{m,A}$ during a drying process. The metallic constituents of Paste 1 do not melt during the drying process, but the organic constituents of the flux binder evaporate and/or burn off, resulting in a metallic skeleton structure that possesses structural integrity due to the solid organic residues that remain after burning off the liquid flux binder constituents (plate B). A ring of Paste 2 is then dispensed around the printed and dried layer of Paste 1 (plate C). Paste 1 is preferably heavily loaded with high $T_m$ metal particles and Paste 2 is preferably heavily loaded with low $T_m$ metal particles. A device is then placed at the center of and onto the area of printed and dried Paste 1 (plate D). A sintering process is then initiated with a temperature profile. After the sintering process is completed, the joint is fully transformed to IMCs, or IMCs and a metal particle structure as described above. During sintering, the low temperature alloy (constituent A) melts. Shortly after the melting is completed, the low temperature alloy then infiltrates the space between the high temperature particles (constituent B) thus initiating formation of IMCs (plate E).

Process 4: Printing, Drying and Printing (FIG. 9)

Figure 9:
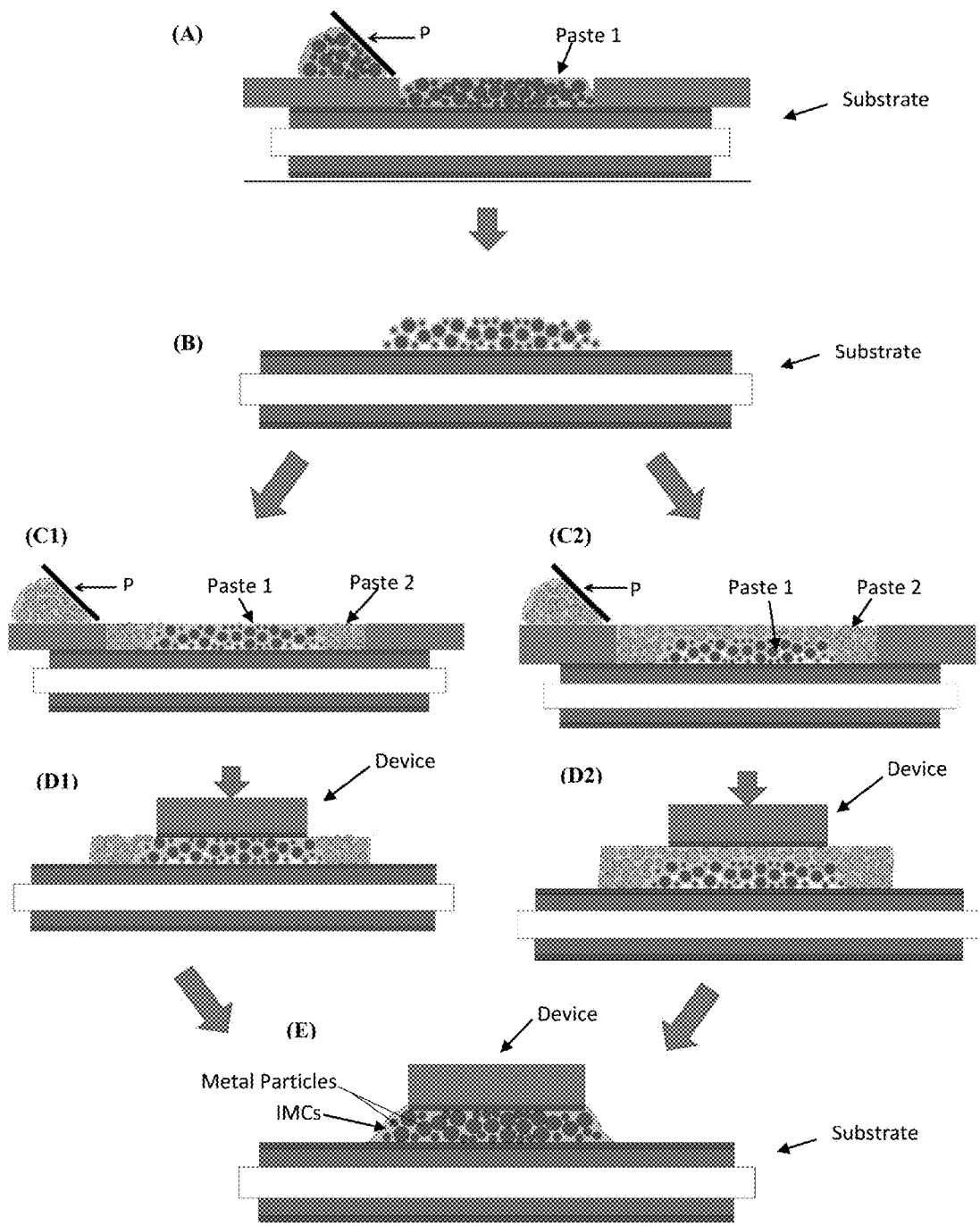
FIG. 9 illustrates schematically a paste application process including: stencil printing Paste 1 onto a substrate (plate A), drying printed Paste (plate B); printing Paste 2 around and/or above printed and dried Paste 1, wherein Paste 2 is either approximately the same thickness as the layer of Paste 1 (plate C1) or thicker than the layer of Paste 1 (plate C2); placing a device onto Paste 1 (plate D1), and/or onto Paste 1 and/or Paste 2 (plate D2); and forming a TLPS joint after sintering (plate E).

Paste 1 is printed on a substrate surface, such as by stencil printing P (FIG. 9, plate A). Next, the layer of Paste 1 printed on the substrate is heated to a temperature below $T_{mA}$ during a drying process. The metallic constituents of Paste 1 do not melt, but the organic constituents of the flux binder evaporate and/or burn off, resulting in a metallic skeleton structure that possesses structural integrity due to the solid organic residues that remain after burning off the liquid flux binder constituents (plate B). A ring of Paste 2 is then printed around the printed and dried layer of Paste 1, such as by stencil printing P. Paste 1 is preferably heavily loaded with high $T_m$ metal particles and Paste 2 is preferably heavily loaded with low $T_m$ metal particles.

The thickness of the printed layer of Paste 2 may be identical to the thickness of the printed and dried layer of Paste 1 (plate C1). Alternatively, the printed layer of Paste 2 may be thicker than the layer of Paste 1 (plate C2), in which case the layer of Paste 2 partially or completely covers the printed and dried layer of Paste 1. A device is then placed at the center of the area of printed and dried Paste 1, either directly onto Paste 1 (plate D1) or onto Paste 2 if thicker than the layer of Paste 1 (plate D2). Thus, the device may be in contact with the metal skeleton of the printed and dried Paste 1, or with Paste 2, or with a combination of both Pastes 1 and 2. A sintering process is then initiated with a temperature profile. After the sintering process is completed, the joint is fully transformed to IMCs, or IMCs and a metal particle structure as described above. During sintering, the low temperature alloy (constituent A) melts. Shortly after the melting is completed, the low temperature alloy infiltrates the space between the high temperature particles (constituent B) thus initiating formation of IMCs (plate E).

While the above-noted application processes provide for application of the sinter pastes via stencil printing and/or deposition (e.g., such as using a nozzle or syringe), any application method known in the art may be utilized. As such, the present invention is not so limited. In addition, the specific percentages of low $T_m$ metal particles, high $T_m$ metal particles, and/or flux materials in Paste 1 and Paste 2 may vary. However, in preferred embodiments, Paste 1 includes a higher percentage of high $T_m$ metal particles compared to low $T_m$ metal particles, and Paste 2 includes a higher percentage of low $T_m$ metal particles compared to high $T_m$ metal particles.

The total amount of high $T_m$ metal particles in combined Pastes 1 and 2 is preferably sufficient so that only a portion of the total high $T_m$ metal particles (e.g., 60-80 wgt-%, more preferably 65-75 wgt-%) are consumed or reacted during the sintering process, thereby leaving a portion of intact high $T_m$ metal particles (e.g., 20-40 wgt-%, more preferably 25-35 wgt-%) in the resulting sintered joint. The remaining intact high $T_m$ metal particles along with the formed IMCs substantially increase joint strength. The percentage of high $T_m$ metal particles may be controlled, for example to provide more or less intact high $T_m$ metal particles, by adjusting the sinter paste compositions, e.g., by increasing the percentage of high $T_m$ metal particles in Paste 1 and/or Paste 2.

Alternatively and/or in addition, the percentage of high $T_m$ metal particles in combined Pastes 1 and 2 may also be controlled by adjusting the amount of Paste 1 (or the amount of Paste 2) relative to the total combined volume of Pastes 1 and 2. For example, if a fixed total volume of sinter pastes (Pastes 1 and 2) is utilized, the percentage of high $T_m$ metal particles may be increased in the fixed total volume of sinter pastes by increasing the amount of Paste 1 (which is more heavily loaded with high $T_m$ metal particles) and decreasing the amount of Paste 2 (which is more heavily loaded with low $T_m$ metal particles).

The percentage of remaining high $T_m$ metal particles may also be controlled in part by limiting the duration of the sintering process so that at least a portion of high $T_m$ metal particles are not reacted or consumed during processing.

All of the disclosed TLPS reflow processes form high melting temperature joints at relatively low process temperatures, e.g., such as processing temperatures between about 10° C. and about 100° C., more preferably between about 10° C. and about 50° C., above the low melting temperature of constituent A. The melting temperature of IMCs ($T_{m,IMC}$) formed during the sintering process is significantly higher than the low melting temperature of constituent A (wherein $T_{m,IMC} > T_{mA}$). In one embodiment, the sintering process provides for the formation of Cu—Sn IMCs. In another embodiment, the process provides for the formation of Ni—Sn IMCs. In another embodiment, the process provides for the formation of (Ni,Cu)—Sn IMCs.

Additional characteristics and features of the present invention will be further understood through reference to the following further discussion and examples, which are provided by way of further illustration and are not intended to be limiting of the present invention.

Preparation and Process Completion

A procedure for preparing sinter pastes includes: mixing of high and low melting temperature metal particles by predefined weight ratios; blending the dry powder mix into an organic binder material to form a sinter paste; applying (stencil printing, depositing, etc.) the sinter paste onto a substrate; and placing a die and processing (see Greve et al. (2013) "*Transient Liquid Phase Sintered Attach for Power Electronics,*" 63$^{rd}$ IEEE Electronic Components and Technology Conference).

The sinter pastes are preferably optimized for pressureless sintering. To reduce joint voiding, a low pressure of <1 MPa (preferably <0.5 MPa) was applied to the die during sintering. Whereas for the pressure-less pastes, Cu-substrates and Cu-dice were used, here Ni coupons with a side length of 6.35 mm as well as power diodes with Ag-metallization and a side length of 7 mm were joined to Ni plates. The different metallization types enabled an assessment of the wetting behavior of the TLPS process for Ni, Cu, and Ag surfaces.

Figure 10:
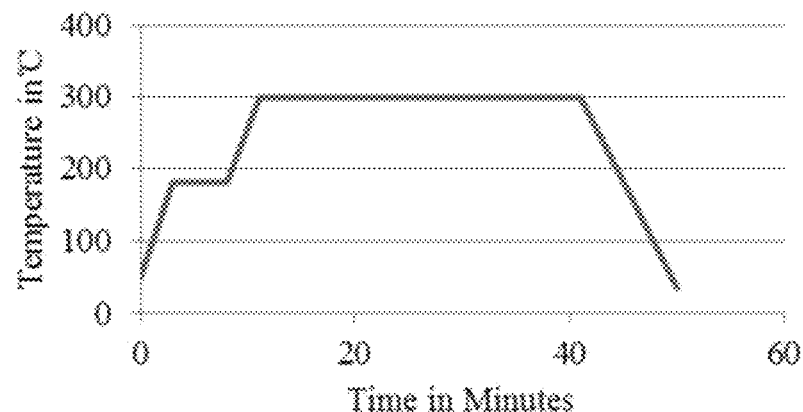
FIG. 10 illustrates graphically a sinter process temperature profile.

Ni—Cu—Sn and Ni—Sn sinter joints showed process completion after less than 10 and 30 minutes above the melting temperature of Sn (232° C.), respectively. Joints manufactured were sintered for 30 minutes at 300° C. to ensure process completion for both types of pastes. The sinter process temperature profile is shown in FIG. 10, and includes two isothermal steps: the first step is a 5 minute hold at 180° C., below the Sn melting temperature to activate the organic binders; the second step is the 30 minute hold at 300° C. during which the Sn melts and the TLPS process is initiated. The sinter pastes consisted of Ni, Cu, and Sn3.5Ag solder spheres.

Sinter Joint Analysis

Cu—Sn System

Figure 11:
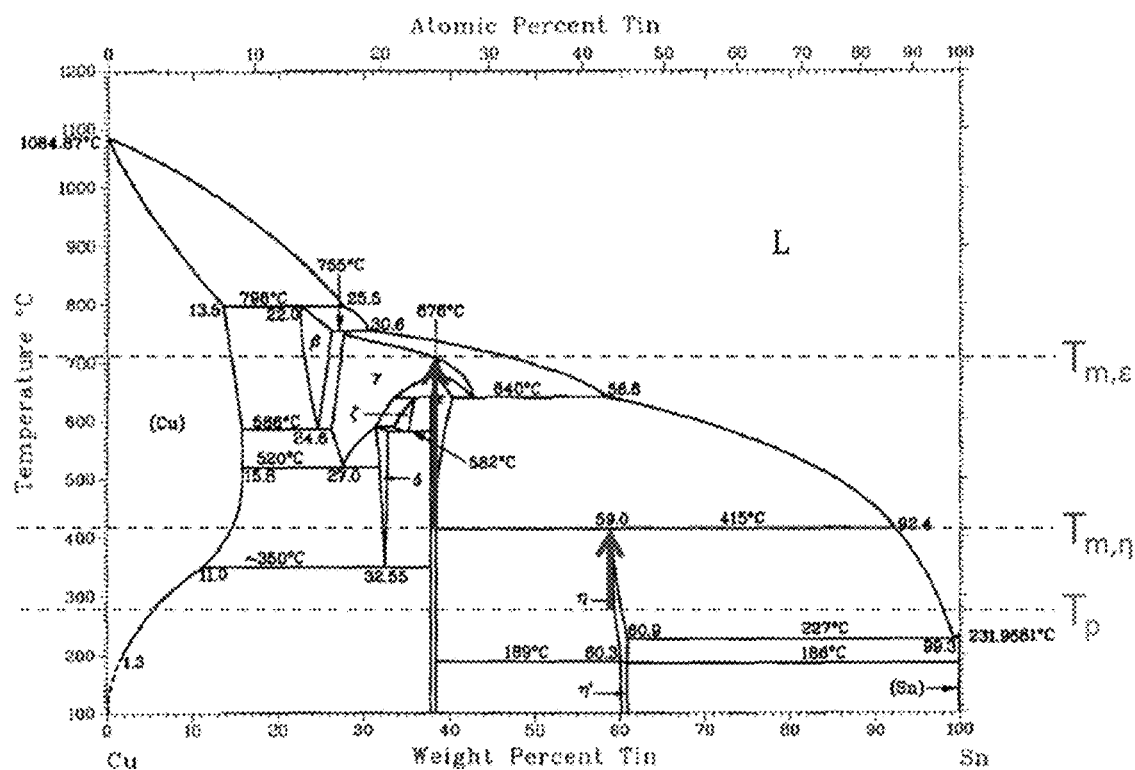
FIG. 11 is a Cu—Sn phase diagram.

FIG. 11 is a Cu—Sn phase diagram showing melting temperatures of Sn and Cu of 232° C. and 1085° C., respectively. If the process temperature ($T_p$) is raised above 232° C. (e.g., such as to about 280° C.), Sn melts and wets Cu. Solid-liquid inter-diffusion is thereby initiated, and $Cu_6Sn_5$ IMCs and $Cu_3Sn$ IMCs form and grow, wherein Sn from the liquid phase is consumed and converted to the IMCs. Fully formed $Cu_6Sn_5$ IMCs and $Cu_3Sn$ IMCs (with Sn concentrations of 60% and 38% by weight, respectively) are formed with melting temperatures for the IMCs shifted to 415° C. and >640° C., respectively. The duration for process completion is relatively short due to high diffusivity of Cu and Sn. However, Cu can oxidize and there is a volume reduction during reaction to form the IMCs which may lead to voiding as noted above, and therefore the Cu—Sn system may not be appropriate for particular applications.

Figure 12:
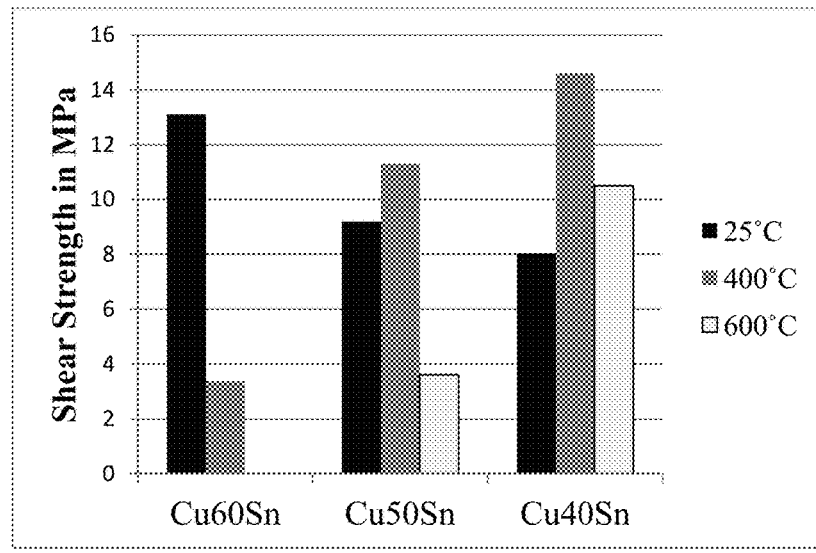
FIG. 12 illustrates graphically shear strength of three Cu—Sn sinter pastes: Cu60Sn, Cu50Sn, and Cu40Sn, tested at temperatures of 25° C., 400° C., and 600° C.

Shear strength of Cu—Sn joints was evaluated utilizing samples including Cu dummy dice and Cu substrates joined with a printed layer of one of three Cu—Sn sinter pastes: Cu60Sn, Cu50Sn, and Cu40Sn, having Cu concentrations of 40%, 50%, and 60% by weight, respectively. A high-temperature shear test setup was designed to determine shear strength at temperatures of 25° C., 400° C., and 600° C. As shown in FIG. 12 and Table 1 below, an increase in Cu content improved high temperature strength, but reduced strength at 25° C. (exemplary ambient temperature). Cu50Sn joints showed no reduction in shear strength up to 400° C., while Cu40Sn pastes showed no reduction in shear strength up to 600° C. Cu60Sn exhibited residual shear strength of about 3 MPa above 400° C., and Cu50Sn exhibited residual shear strength of about 3 MPa at 600° C. Thus, Cu—Sn pressure-less TLPS pastes are suitable for forming high-temperature resilient joints at relatively low process temperatures and in reasonably short durations for process completion.

TABLE 1

Cu—Sn Shear Strength at 25° C., 400° C., and 600° C.

|  | Shear Strength (MPa) at 25° C. | Shear Strength (MPa) at 400° C. | Shear Strength (MPa) at 600° C. |
| --- | --- | --- | --- |
| Cu60Sn | 13.11 | 11.21 | 3.38 |
| Cu50Sn | 9.18 | 11.30 | 3.61 |
| Cu40Sn | 8.03 | 14.61 | 10.49 |

Ni—Sn System

Figure 13:
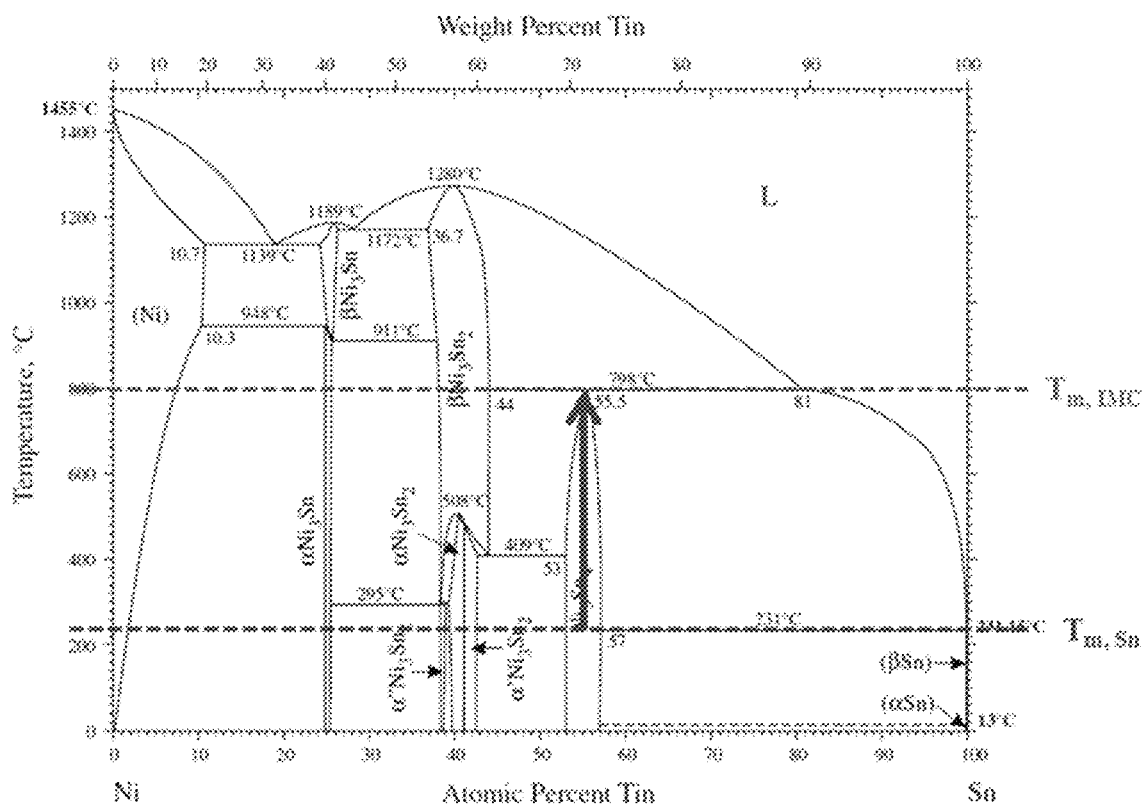
FIG. 13 is a Ni—Sn phase diagram.

FIG. 13 is a Ni—Sn phase diagram showing melting temperatures of Sn and Ni of 232° C. and 1455° C., respectively. If the process temperature ($T_p$) is raised above 232° C. (e.g., such as to about 280° C.), Sn melts and wets Ni. Solid-liquid inter-diffusion is initiated, and $Ni_3Sn_4$ IMCs form and grow, wherein Sn from the liquid phase is consumed and converted to $Ni_3Sn_4$. If the percentage of Ni in the Ni—Sn joint exceeds 43 at-%, substantially all Sn is consumed by the formation of IMCs. Upon process completion, the resulting joint comprises Ni and Ni—Sn IMCs, with $T_m$ of about 798° C. Thus, the melting point of the resulting joint ($T_{m,joint}$) is shifted by 566° C.

Exemplary TLPS sinter joints were further assessed, based on Ni—Sn and Ni—Cu—Sn sinter pastes. The melting-temperature and the minimum Ni/Cu percentages of $Ni_3Sn_4$ IMCs for the Ni—Sn system are presented in Table 2 below, as well as for $Cu_6Sn_5$ and $Cu_3Sn$ IMCs for the Cu—Sn systems. Processing was done at 280° C. As shown, $Ni_3Sn_4$ IMCs with a melting temperature of 798° C. were fully formed at Sn concentrations of 72 wgt-% or less. Higher concentrations of the liquid phase facilitated the sintering process and reduced voiding.

$Ni_3Sn_4$ IMCs had the highest percentage of Sn in the Ni—Sn systems, and was the Ni—Sn system that first formed during the TLPS process. $Ni_3Sn_4$ IMCs possess a $T_m$ of 798° C., and thus exhibit a shift in melting temperature of the sinter joint ($T_{m,joint}$) of 566° C. as noted above. $Cu_6Sn_5$ IMCs had the highest percentage of Sn in the Cu—Sn systems, and was the Cu—Sn system that first formed during the TLPS process. $Cu_6Sn_5$ IMCs possess a $T_m$ of 416° C., and thus exhibits a shift in melting temperature of the sinter joint ($T_{m,joint}$) of 184° C. With additional annealing time at elevated temperatures, $Cu_6Sn_5$ IMCs may be transformed to $Cu_3Sn$ IMCs, which possess a $T_m$ of more than 640° C. (depending on Cu percentage).

TABLE 2

Melting Temperatures of $Ni_3Sn_4$, $Cu_6Sn_5$, and $Cu_3Sn$ IMCs and their associated atomic percent (at-%) and weight percent (wgt-%).

| | IMC | | | | | |
| --- | --- | --- | --- | --- | --- | --- |
| | $Ni_3Sn_4$ | | $Cu_6Sn_5$ $T_m$ | | $Cu_3Sn$ | |
| | 798° C. | | 416° C. | | >640° C. | |
| | Ni | Sn | Cu | Sn | Cu | Sn |
| at-% | 43 | 57 | 55 | 45 | 75 | 25 |
| wgt-% | 28 | 72 | 40 | 60 | 62 | 38 |

Lower percentages of high melting-temperature constituents facilitate the sintering process and reduce voiding, as more liquid phase is present that can fill voids between the solid metal particles. Thus, as shown in Table 2 above, higher percentages of Sn liquid phase facilitates the sintering process. When comparing preferred weight percentages utilized for the formation of the three types of IMCs tested ($Ni_3Sn_4$ IMCs, $Cu_6Sn_5$ IMCs, and $Cu_3Sn$ IMCs), the Ni—Sn system exhibited an advantage over the tested Cu—Sn systems with regard to melting temperature. Yet, Ni—Sn IMCs formed considerably slower than some Cu—Sn IMCs due to a lower diffusivity of Sn and Ni as compared to that of Sn and Cu. Thus, the required time for process completion for $Cu_6Sn_5$ sinter joints was shorter as compared to the required time for process completion for $Ni_3Sn$ sinter joints. However, the formation of $Cu_3Sn$ IMCs required extensive annealing time due to the need to rely on solid-solid diffusion or an increase of process temperature to above 416° C. to melt the $Cu_6Sn_5$ IMCs.

Microstructural Analyses

Figure 14:
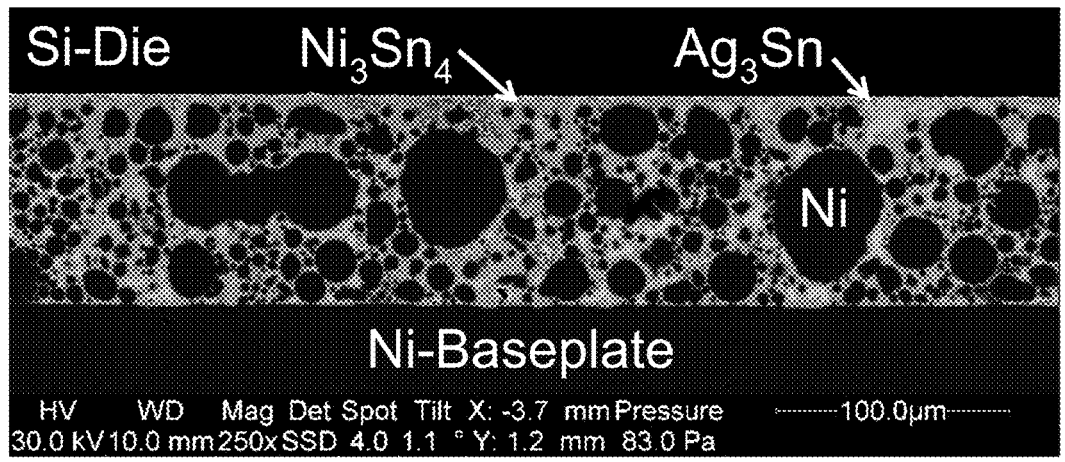
FIG. 14 is a cross-sectional scanning electron microscope (SEM) image of a Ni—Sn interconnect joining a Ni-substrate and a Si-die at magnification ×250.
Figure 15:
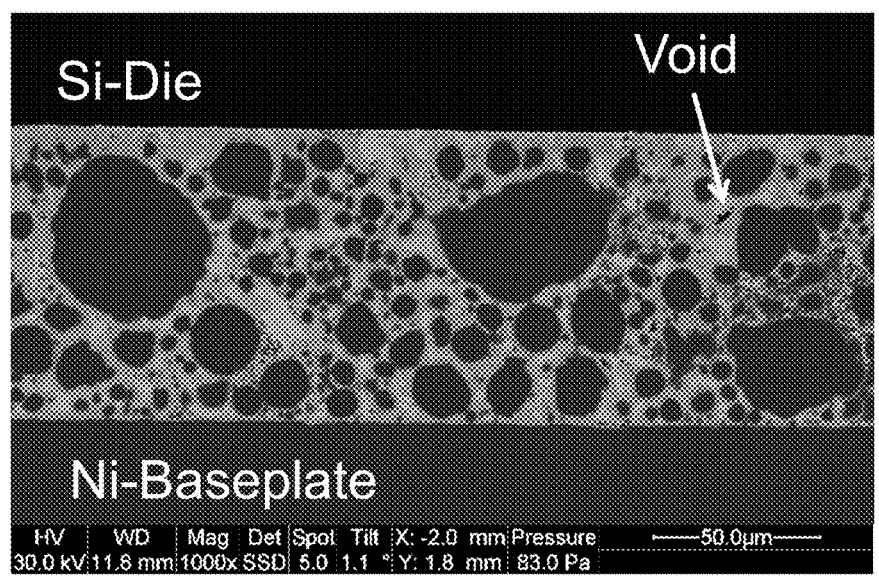
FIG. 15 is another cross-sectional SEM image of the Ni—Sn interconnect shown in FIG. 14 at magnification ×1000.

A cross-section of a Ni—Sn sinter joint joining a Ni-substrate or baseplate and a Si-die is shown in FIGS. 14 and 15 at magnifications ×250 and ×1000, respectively. The sinter paste constituents of the TLPS joint included 29 wgt-% Ni and 71 wgt-% Sn3.5Ag microspheres. Process temperature was 280° C.; applied pressure was <1 MPa; and time above Sn melting temperature was <30 minutes (with a longer process duration compared to Cu—Sn systems). Upon process completion, all Sn was converted to $Ni_3Sn_4$. The resulting joint exhibited a melting temperature of 798° C. Thus, the melting temperature of the resulting joint ($T_{m,joint}$) shifted by 566° C. Minimal voiding was observed within the joint. In addition, the sinter paste showed excellent wetting capabilities.

Figure 16:
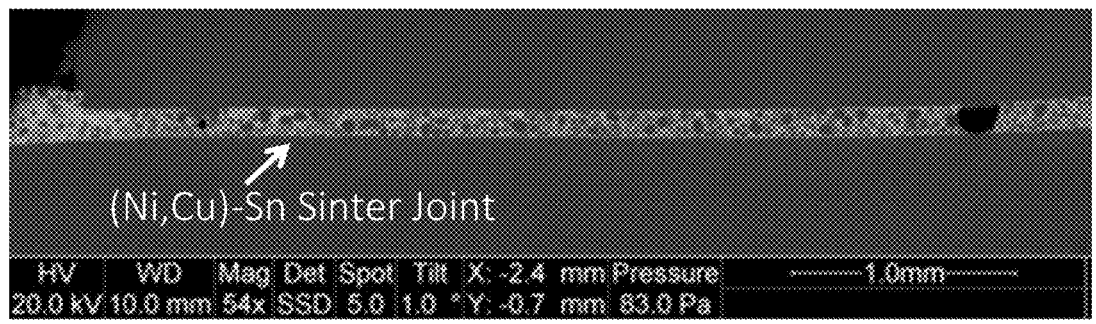
FIG. 16 is a cross-sectional SEM image of a (Ni,Cu)—Sn interconnect joining a Ni-substrate and a Ni-die at magnification ×54.
Figure 17:
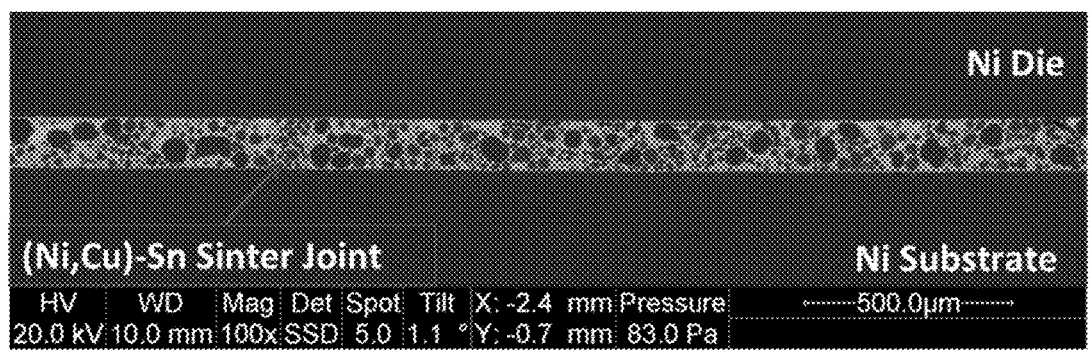
FIG. 17 is another cross-sectional SEM image of a portion of the (Ni,Cu)—Sn interconnect shown in FIG. 16 at magnification ×100.

Cross-sections of a (Ni,Cu)—Sn sinter joint at magnifications of ×54 and ×100 are shown in FIGS. 16 and 17, respectively. The TLPS joint was formed by a sinter paste comprising 33% Ni and 33% Cu as the high melting temperature constituents, and 34% Sn3.5Ag solder alloy as the low melting temperature constituent (ratios given in weight-%). The sinter paste was used to join two Ni-plates (Ni die and Ni substrate). The process completion time above the melting point of the Sn3.5Ag alloy was about 10 minutes. A relatively low applied pressure of <1 MPa was applied to the die during sintering. As shown, very low voiding was present within the joint, with only one void visible (see FIG. 16). The sinter paste showed excellent wetting capabilities and formed continuous IMCs bonding the substrate and die, and Cu and Ni particles of the sinter paste.

Figure 18:
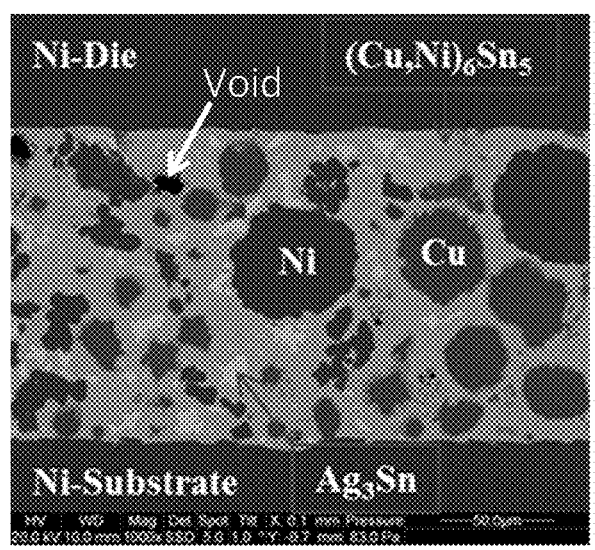
FIG. 18 is another cross-sectional SEM image of a portion of the (Ni,Cu)—Sn interconnect shown in FIG. 16 at magnification ×1000.

A detailed cross-section of the Cu—Ni—Sn sinter joint at higher magnification is shown in FIG. 18. A complex microstructure was formed, characterized by Ni-particles, Cu-particles, and Ag—Sn IMCs (lighter areas) connected by $(Cu,Ni)_6Sn_5$ IMCs. The sinter paste showed excellent wetting capabilities, and the joint possesses minimal voiding. Residual Ni and Cu particles that were only partially consumed were present in the joint. $Ag_3Sn$ IMCs were present throughout the joint, originating from the Sn3.5Ag solder used as the low melting temperature constituent. As the Cu—Ni—Sn IMCs grew, the free space for the $Ag_3Sn$ IMCs became more constrained, and small particles coalesced.

Figure 19:
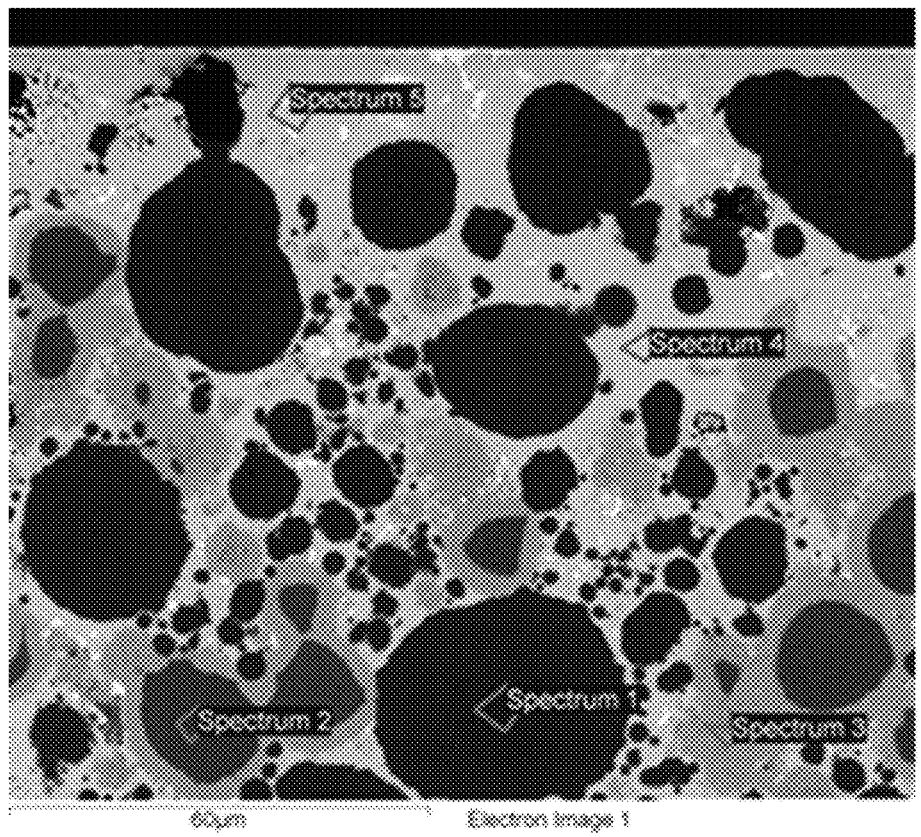
FIG. 19 illustrates energy-dispersive x-ray spectroscopy (EDX) analysis of a joint showing $(Cu,Ni)_3Sn$ and $(Cu,Ni)_6Sn_5$ as intermetallic compounds. The ratio of Ni:Cu in the formed IMCs was between 1:6 and 1:3.

As shown in FIG. 19, EDX analysis of the microstructure of a Cu—Ni—Sn sinter joint shows $(Cu,Ni)_3Sn$ and $(Cu,Ni)_6Sn_5$ IMCs. Ni particles were alloyed with Cu and transformed to (Ni) (Spectrum 1). Cu particles were alloyed with Ni and transformed to (Cu) (Spectrum 2). Proximate to (Cu) regions, Ni—Cu—Sn IMCs with two different stoichiometries, $(Cu,Ni)_3Sn$ and $(Cu,Ni)_6Sn_5$ IMCs, were formed (Spectra 3 and 4). The percentage of Ni:Cu in these IMCs was found to be between 1:6 and 1:3. The size, distribution, and Ni-to-Cu ratios are expected to change under conditions of significant additional diffusion, e.g. thermal cycling with high dwell temperatures and thermal annealing. The structure is similar to that of Cu—Sn TLPS joints, but includes a fraction of Ni atoms diffused into the IMCs. $(Cu,Ni)_6Sn_5$ IMCs formed initially between Ni and Cu, followed by additional diffusion of Ni and/or Cu atoms, thereby transforming the IMCs to $(Cu,Ni)_3Sn$ near (Cu) regions (Spectrum 5). Compounds found by the EDX analysis are presented in Table 3:

TABLE 3

EDX Analysis

| Spectrum | Composition in atomic-% | Stoichiometry |
|---|---|---|
| 1 | Ni: 95.72<br>Cu: 2.74<br>Sn: 1.53 | Ni |
| 2 | Ni: 8.66<br>Cu: 89.09<br>Sn: 2.25 | Cu |
| 3 | Ni: 10.47<br>Cu: 64.83<br>Sn: 24.70 | $(Cu,Ni)_3Sn$ |
| 4 | Ni: 12.90<br>Cu: 45.79<br>Ag: 0.82<br>Sn: 40.48 | $(Cu,Ni)_6Sn_5$ |
| 5 | Ni: 8.16<br>Cu: 44.58<br>Ag: 3.98<br>Sn: 43.28 | $(Cu,Ni)_6Sn_5$ |

The trace amounts of Ag detected were due to Ag metallization on the diode (for wetting) during the sintering process.

Figure 20:
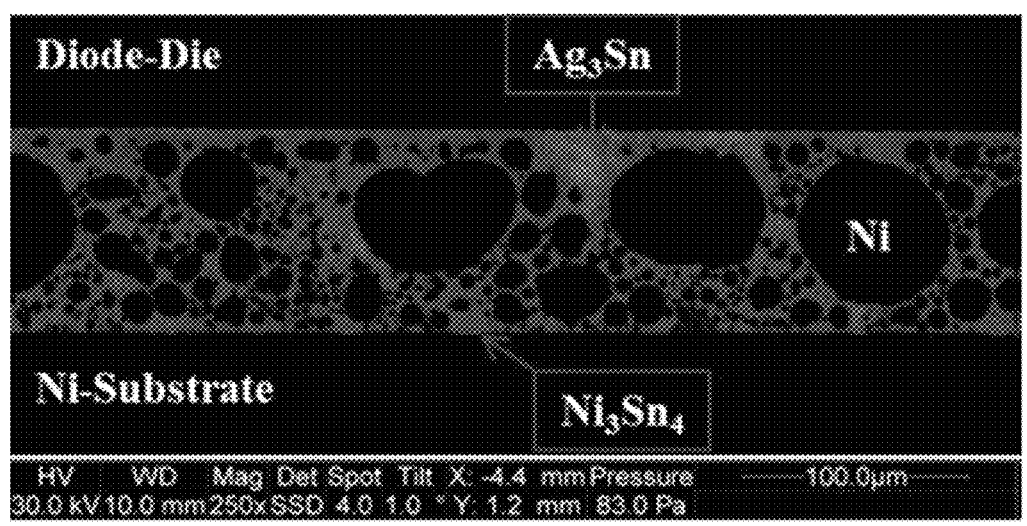
FIG. 20 is a cross-sectional SEM image of a Ni—Sn interconnect joining a Ni-substrate and a die of a Si power diode at magnification ×250.

A cross-section of a Ni—Sn sinter interconnect joining a silicon power diode with an Ag-metallization and a Ni-substrate is shown in FIG. 20. Excellent wetting of Ni and Ag was observed, and relatively low levels of voiding were present in the joint. EDS analyses confirmed that two types of IMCs were present—$Ag_3Sn$ IMCs from residual Ag of the Sn3.5Ag solder, and $Ni_3Sn_4$ IMCs. The Ni—Sn joint required a longer duration (<30 minutes) for process completion as compared to the duration for process completion of the (Ni,Cu)—Sn sinter joint.

Softening Behavior and Joint Cohesion

Figure 21:
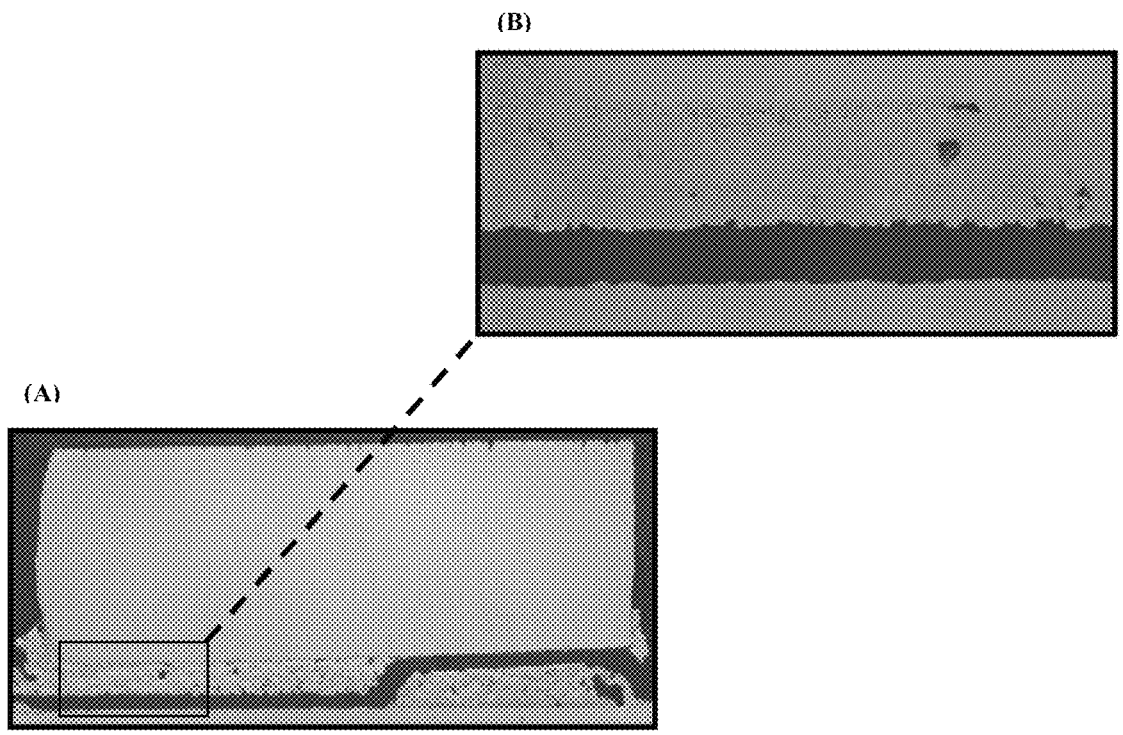
FIG. 21 is a cross-sectional SEM image of a device including a (Ni,Cu)—Sn interconnect (plate A, with exploded view of boxed area shown in plate B), which exhibited excellent shear strength of approximately 30-40 MPa at room temperature.

To ensure long fatigue life under elevated thermal conditions, interconnect materials need to possess good strength at relatively high temperatures. In order to test joint strength, a high temperature shear test was developed (see Greve et al. (2013) "*Transient Liquid Phase Sintered Attach for Power Electronics,*" 63$^{rd}$ IEEE Electronic Components and Technology Conference). Ni—Sn and (Cu,Ni)—Sn sinter paste interconnects exhibited excellent shear strength of approximately 30-40 MPa at room temperature (see FIG. 21).

Figure 22:
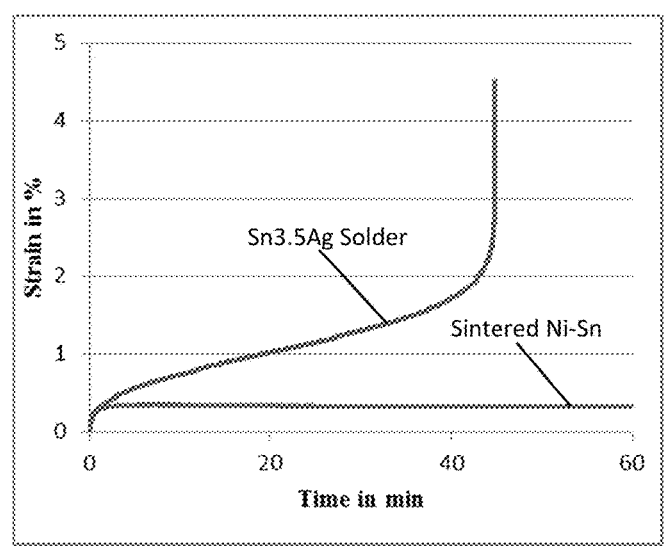
FIG. 22 illustrates graphically deformation or strain over time in sintered Ni—Sn interconnect specimens and baseline Sn3.5Ag solder specimens.

In order to test deformation or creep, shear stress of 20 MPa at room temperature was applied to the Ni—Sn and (Cu,Ni)—Sn interconnects, as well as baseline Sn3.5Ag specimens. Minimal or no deformation was observed in the Ni—Sn and (Cu,Ni)—Sn specimens after hours of testing (FIG. 22), demonstrating the potential for applications with extended dwell times at elevated temperature. In contrast, the baseline Sn3.5Ag specimens failed within a short test duration (about 40 minutes).

To analyze the melting behavior of the sinter joints, a softening test was performed. Specimens were manufactured by sintering Ni-dies on Ni-substrates with the same dimensions as for the pressureless tests. They were processed for 30 minutes at 300° C., and a low pressure (<0.5 MPa) was applied homogeneously on the die. No vacuum, inert, or reducing atmosphere was applied. After manufacturing, the specimens were placed into a high temperature tension testing system. A shear load of 10 MPa was applied to the joints, and the temperature was increased continuously. When a drop in shear strength below 10 MPa occurred (a strength level much higher than the criteria set by shear test standards and thus adequate for reliable power device attachment), the corresponding temperature of such occurrence was designated as the softening temperature.

Figure 23:
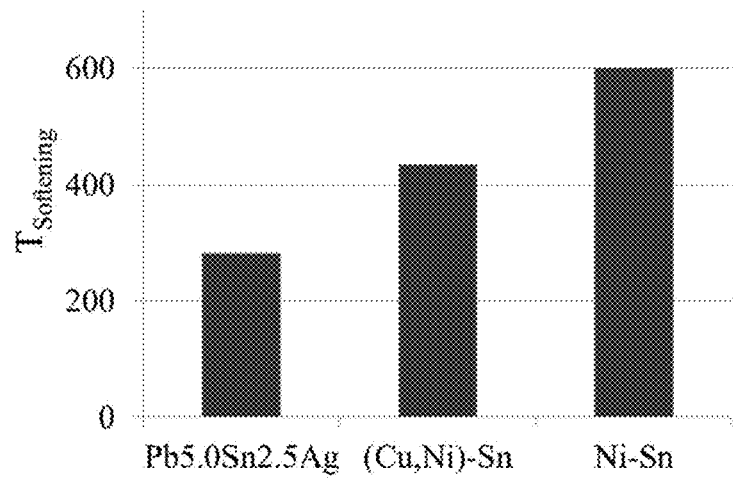
FIG. 23 illustrates graphically softening temperature ($T_{softening}$) of Pb5.0Sn2.5Ag, (Cu,Ni)—Sn, and Ni—Sn joints (wherein criteria is a drop of shear strength below 10 MPa).

As shown in FIG. 23, the softening behavior is shown for joints formed by Pb5.0Sn2.5Ag, a high-lead solder with a solidus temperature of 287° C., as well as joints formed by (Cu,Ni)—Sn and Ni—Sn TLPS sinter pastes. Softening of Pb5.0Sn2.5Ag was detected at 282° C., which is in agreement with its solidus temperature of 287° C. The (Cu,Ni)—Sn joint softened at 435° C., which is close to the melting temperature of $Cu_6Sn_5$ IMCs of 416° C. No softening or reduction of shear strength was detected for the Ni—Sn sinter joint for test setup temperatures up to 600° C. Thus, a melting temperature shift of 214° C. was demonstrated for the (Cu,Ni)—Sn joint, from 221° C. (the melting point of the Sn3.5Ag solder alloy) to 435° C. A shift of more than 379° C. was demonstrated for the Ni—Sn joint, from 221° C. to above 600° C.

Mechanical Drop Shock Testing

Many applications require reliability in combined mechanical shock, vibration, and thermal cycling (e.g., automotive, oil/gas exploration, etc.). As such, the ability of an interconnect material to survive dynamic loads is a crucial factor for reliability of many electronic packages. From prior vibration and shock tests of solder interconnects, it is known that dynamic joint failure may occur within IMCs that form between the solder and the substrate during processing or operation. It has therefore been hypothesized that the IMC layer is the limiting factor for the reliability of interconnects under drop shock conditions.

As discussed above, IMCs are the main constituents of the TLPS sinter joints. If the reliability of interconnects is limited by the amount of IMCs, TLPS interconnects would be expected to exhibit limited life time under dynamic drop loads. The formation of IMCs in these joints was thus analyzed to qualify interconnect reliability under dynamic loading conditions (see Kim et al. (1995) *"Three-dimensional morphology of a very rough interface formed in the soldering reaction between eutectic SnPb and Cu,"* Appl. Phys. Lett., vol. 66, no. 18, pp. 2337-2339).

Many consumer electronics manufacturers focus on the mechanical reliability of component to board connections (solder joints). Standard methods are available to assess useful life of these connections (e.g., such as JEDEC Standard: JESD22-B111). However, there is no specific standard method which includes the mechanical reliability evaluation of die attach materials. In most cases, it is expected that the component to board connections fail faster than the die attach material because of the smaller contact area. Increasing the intermetallic content of the die attach materials in transient liquid phase sintering joints requires more investigation into the behavior of these joints under mechanical shock loads. Drop shock testing was therefore considered as a qualification method to simulate highly accelerated mechanical loads on TLPS sinter joints.

Due to the lack of a standard method to assess mechanical reliability of die attach materials under drop shock loading, a method similar to Board Level Drop Test Method of components for Handheld Electronic Products (e.g., JEDEC Standard: JESD22-B111) and the qualification method for TLPS adhesive composites was utilized (see Shearer et al. (1999) *"Transient liquid phase sintering composites: Polymer adhesives and metallurgical bonds,"* J. Electron. Mater. 28(11):1319-1326). Exploratory tests were designed in order to define the reliability of the samples. Ni—Sn sinter specimens were tested for a combination of 500 drop cycles under 1500 G acceleration from 19.3 inch height drop tower, combined with 10 drops under 7350 G acceleration from 62 inch height drop tower. The acceleration pulse duration was 0.5 milliseconds, following a half sine curve similar to JEDEC Standard requirements. The samples were cross-sectioned after the shock cycles and investigated for initiated cracks.

Figure 24:
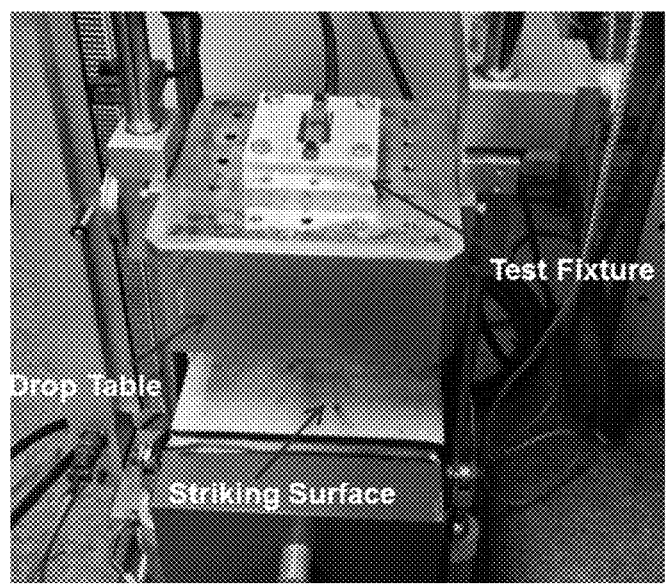
FIG. 24 is an image of an exemplary arrangement for a drop tower and sample fixture mounted thereon.
Figure 25:
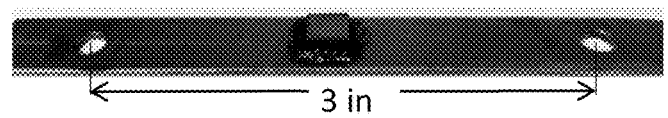
FIG. 25 is an image of a Ni—Sn TLPS drop test sample.

To mount the samples on the drop tower, an aluminum fixture was utilized. The exemplary fixture and mounting arrangement on the drop tower are shown in FIG. 24. Samples were prepared by attaching a Ni die (0.25×0.25×0.125 in$^3$) onto a Ni substrate (4.0×0.5×0.062 in$^3$) with Ni—Sn TLPS sinter paste and Sn3.5Ag solder (joint thickness 100 µm), as shown in FIG. 25. Visual inspection of the samples was conducted using light microscopy, with no cracking in the joint observed. (The Ni substrate was bent after 10 drops from the higher 62 inch height, but no cracking in the joint was observed).

Figure 26:
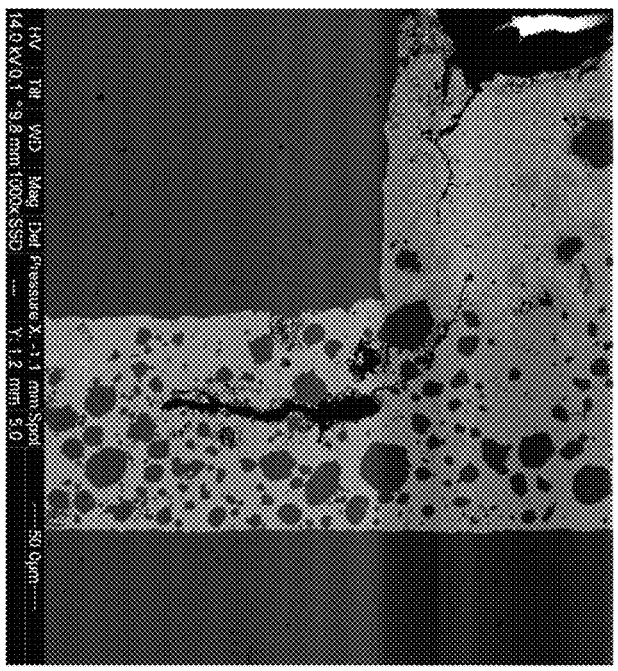
FIG. 26 is a SEM image of a Ni—Sn sinter joint between a Ni-die and Ni-stripe after drop tests at magnification ×1000.
Figure 27:
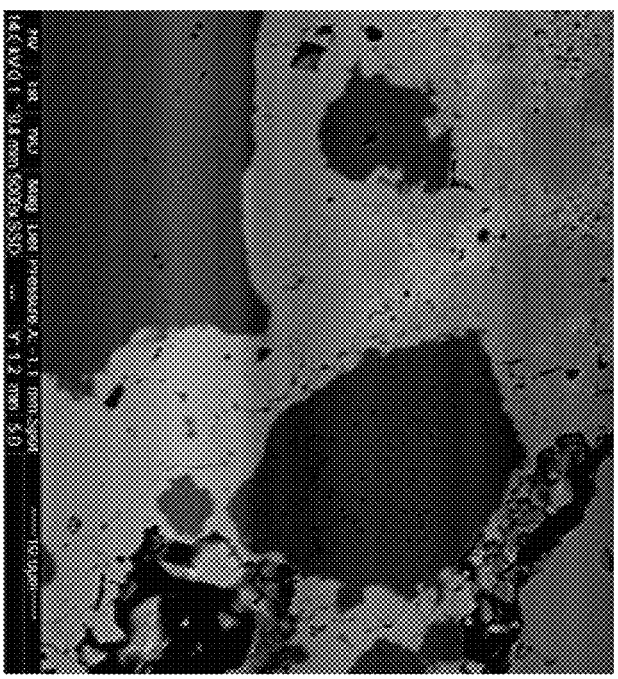
FIG. 27 is another SEM image of the Ni—Sn sinter joint shown in FIG. 26 at magnification ×5000.

Environmental Scanning Electron Microscopy (ESEM) was also used to further evaluate any cracking. ESEM images of a Ni—Sn TLPS sinter joint after drop cycling are shown in FIGS. 26 and 27 at magnifications ×1000 and ×5000, respectively. As seen, only small micro-fractures were observed at the joint edges. Two cracks were initiated at the solder-to-IMC interface. The first crack propagated on the edges of the intermetallic, and the second crack went through the intermetallic and stopped at a void. As shown in FIG. 26, small micro-fractures were visible near a Ni particle at the die corner. No other cracks were observed in the cross section.

Figure 28:
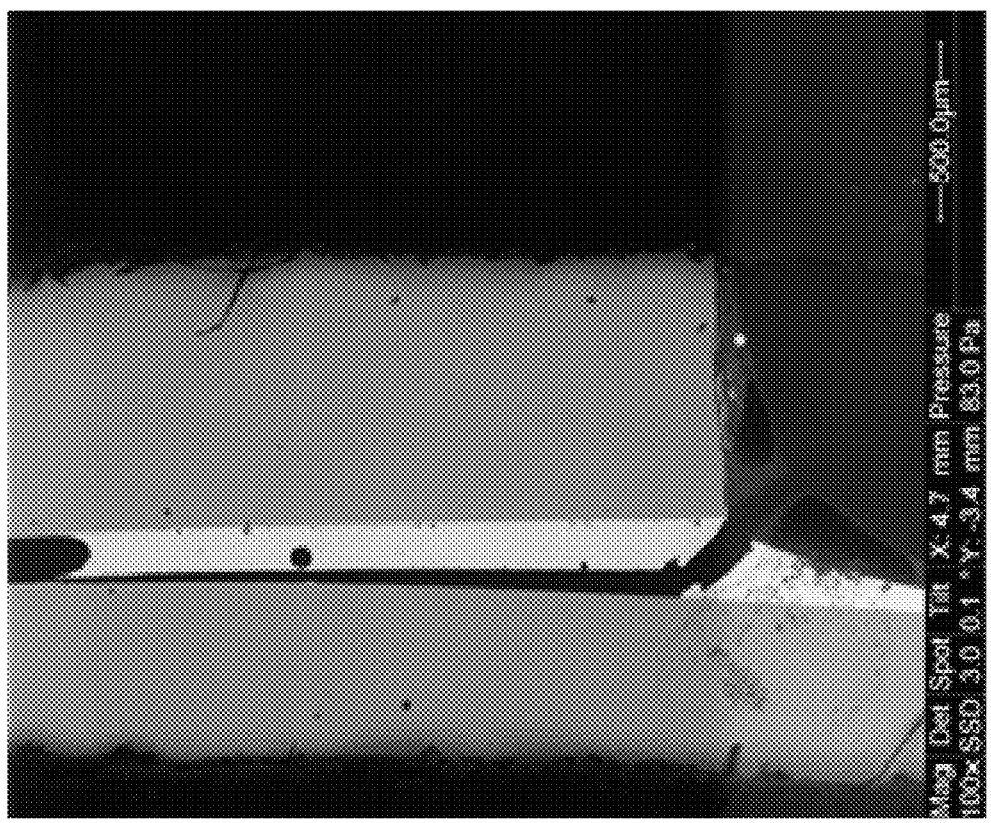
FIG. 28 is a SEM image of a Sn3.5Ag solder joint between a Ni-die and Ni-stripe after drop tests at magnification ×1000.

For comparison, a test sample made of a Ni die attached to a Ni substrate via a conventional Sn3.5Ag solder joint was subjected to the same drop shock testing conditions, and then cross-sectioned after 500 drops from the same 19.3 inch height drop tower and 10 drops from 62 inch height. The sample was then analyzed to assess joint condition (FIG. 28). The sample showed detachment from the substrate at a lower interface of the solder and substrate. A crack started at the edge of the die and propagated though the interface of solder material and Ni substrate. The solder material crack growth under mechanical drop shock loading was much faster compared to that of the Ni—Sn sinter paste joints, and the Sn3.5Ag solder joint was close to detachment.

On contrast, the Ni—Sn sinter joints showed no sign of detachment after drop-shock testing, and no visible cracks were seen during the visual inspections. Thus, while it is possible that some IMCs would be the location of minimal crack propagation, sintered joints comprising (Ni,Cu)—Sn IMCs and intact metallic particles substantially minimized the initiation and propagation of cracking, thereby substantially improving reliability under dynamic loads. The results herein demonstrate that the disclosed (Ni,Cu)—Sn and Ni—Sn TLPS sinter paste joints possess superior strength and much higher reliability under drop loading as compared to conventional joints.

Thus, the disclosed paste-based (Ni,Cu)—Sn and Ni—Sn TLPS systems are suitable for high-temperature attach technology. The sinter pastes and multi-step processing methods result in extremely reliable joints, which are capable of reliably performing under extreme thermal conditions or high mechanical loads. The disclosed sinter pastes enable the formation of joints at relatively low process temperatures, while showing excellent strength and reliability at room temperature and up to 600° C. or more. For example, (Ni,Cu)—Sn and Ni—Sn sinter pastes may be processed below 300° C., while showing softening at 435° C. and above 600° C., respectively. No vacuum or reducing atmosphere is required, and process duration is relatively short.

The resulting joints exhibit extremely high strength even at elevated temperature conditions, and possess limited voiding and minimal creep at room temperature and up to relatively high loads (e.g., 20 MPa shear force). They also exhibit excellent wetting capabilities on different metallizations common in electronic systems (e.g., Cu, Ni, Ag). Cyclic drop tests showed that Ni—Sn sinter joints exhibit superior drop test reliability for high loads compared to conventional solder joints (e.g., such as Sn3.5Ag joints), which is counterintuitive to the conventional belief that the formation of large IMCs is detrimental to dynamic load fatigue life. The disclosed sinter pastes and processes therefore show great potential as a reliable interconnect for many applications.

All identified publications and references are herein incorporated by reference to the same extent as if each individual publication was specifically and individually indicated to be incorporated by reference in its entirety. While the invention has been described in connection with exemplary embodiments thereof, it will be understood that it is capable of further modifications and this application is intended to cover any variations, uses, or adaptations of the invention following, in general, the principles of the invention and including such departures from the present disclosure as come within known or customary practice within the art to which the invention pertains and as may be applied to the features hereinbefore set forth.

What is claimed is:

1. A method of forming a joint in an electronic system, comprising the steps of:
   applying a first sinter paste onto a substrate, wherein said first sinter paste comprises low melting temperature metal particles intermixed with high melting temperature metal particles;
   applying a second sinter paste onto said substrate and surrounding said first sinter paste, wherein said second sinter paste comprises low melting temperature metal particles intermixed with high melting temperature metal particles;
   aligning a component with said substrate so that said applied first sinter paste is intermediate and contacting said component and said substrate;
   initiating a sintering process at a process temperature so that said low melting temperature metal particles melt and infiltrate spaces between said high melting temperature particles, thereby forming a sintered joint comprising intermetallic compounds.

2. The method of claim 1, wherein said first sinter paste comprises a first weight percent of said high melting temperature metal particles and a second weight percent of said low melting temperature metal particles, said first weight percent greater than said second weight percent.

3. The method of claim 2, wherein said high melting temperature metal particles comprise one or both of nickel and copper.

4. The method of claim 2, wherein said first weight percent is at least about twice said second weight percent.

5. The method of claim 2, wherein said second sinter paste comprises a third weight percent of said low melting temperature metal particles and a fourth weight percent of said high melting temperature metal particles, said third weight percent greater than said fourth weight percent.

6. The method of claim 5, wherein said low melting temperature metal particles comprise tin.

7. The method of claim 5, wherein said third weight percent is at least about twice said fourth weight percent.

8. The method of claim 1, comprising the further step of drying said applied first sinter paste by heating to a temperature below a melting temperature of said low melting temperature metal particles.

9. The method of claim 1, wherein said applied second sinter paste has a thickness substantially equal to a thickness of said applied first sinter paste.

10. The method of claim 1, wherein said applied second sinter paste has a thickness greater than a thickness of said applied first sinter paste.

11. The method of claim 1, wherein said intermetallic compounds have a melting temperature more than 100° C. greater than a melting temperature of said low melting temperature metal particles.

12. The method of claim 1, wherein said intermetallic compounds have a melting temperature at least twice a melting temperature of said low melting temperature metal particles.

13. The method of claim 1, wherein said formed sintered joint further comprises intact high melting temperature metal particles.

14. The method of claim 13, wherein said intact high melting temperature metal particles comprise one or both of nickel and copper.

15. The method of claim 1, comprising the further step of reacting less than 90% of said high melting temperature metal particles of said first and second sinter pastes during said sintering process, so that said formed sintered joint comprises intermetallic compounds and a plurality of intact high melting temperature metal particles.

16. The method of claim 1, wherein said formed sintered joint comprises a matrix of nickel-tin intermetallic compounds, copper-tin intermetallic compounds, or nickel-copper-tin intermetallic compounds.

17. The method of claim 1, wherein a pressure of less than 1 MPa is applied during said sintering process.

* * * * *